US012672351B2

(12) United States Patent
Li et al.

(10) Patent No.: US 12,672,351 B2
(45) Date of Patent: Jun. 30, 2026

(54) ARRAY SUBSTRATE, DISPLAY PANEL AND MANUFACTURING METHOD THEREOF

(71) Applicants:FUZHOU BOE OPTOELECTRONICS TECHNOLOGY CO., LTD., Fuzhou (CN); BOE TECHNOLOGY GROUP CO., LTD., Beijing (CN)

(72) Inventors: Chunyu Li, Beijing (CN); Lifeng Lin, Beijing (CN); Bo Hu, Beijing (CN); Xin Lin, Beijing (CN); Xin Fang, Beijing (CN); Wenchao Wang, Beijing (CN); Rong Zhou, Beijing (CN); Jianshu Wang, Beijing (CN); Pei Hu, Beijing (CN); Yichiang Lai, Beijing (CN)

(73) Assignees: FUZHOU BOE OPTOELECTRONICS TECHNOLOGY CO., LTD., Fuzhou (CN); BOE TECHNOLOGY GROUP CO., LTD., Beijing (CN)

( * ) Notice: Subject to any disclaimer, the term of this patent is extended or adjusted under 35 U.S.C. 154(b) by 464 days.

(21) Appl. No.: 18/559,600

(22) PCT Filed: Feb. 27, 2023

(86) PCT No.: PCT/CN2023/078508
§ 371 (c)(1),
(2) Date: Nov. 8, 2023

(87) PCT Pub. No.: WO2024/178555
PCT Pub. Date: Sep. 6, 2024

(65) Prior Publication Data
US 2025/0098305 A1 Mar. 20, 2025

(51) Int. Cl.
*H10D 86/60* (2025.01)
*G02F 1/1345* (2006.01)
(Continued)

(52) U.S. Cl.
CPC ......... *H10D 86/60* (2025.01); *G02F 1/13452* (2013.01); *G02F 1/136286* (2013.01);
(Continued)

(58) Field of Classification Search
CPC ........... G02F 1/13452; G02F 1/136286; G02F 1/0412; H10D 86/441; H10K 59/131; H10K 59/88
See application file for complete search history.

(56) References Cited

U.S. PATENT DOCUMENTS 10,991,326 B2  4/2021 Shimoshikiryoh et al.
2017/0372672 A1  12/2017 Shiomi

FOREIGN PATENT DOCUMENTS

CN  107463041 A  12/2017
CN  108140354 A  6/2018
(Continued)

OTHER PUBLICATIONS

CN-108681415-A-Machine English Translation (Year: 2026).*

*Primary Examiner* — Jose R Diaz
(74) *Attorney, Agent, or Firm* — Dilworth & Barrese, LLP.; Michael J. Musella, Esq.

(57) ABSTRACT

An array substrate, a display panel and a manufacturing method thereof are provided. The array substrate includes data lines, gate lines, a gate driving structure electrically connected with the gate lines and the gate driving signal lines, gate driving signal lines and a data fanout wiring region. The array substrate further includes a dummy fanout wiring region, a dummy pad region and a bended line, the data fanout wiring region and the dummy fanout wiring
(Continued)

region are located at both sides of the display region, the data lines are electrically connected with pads in the dummy pad region through the wires in the dummy fanout wiring region; the gate driving signal lines are electrically connected with pads in the dummy pad region; a transmission line is disposed at one side of the gate driving structure away from the display region and electrically connected with the bended line.

20 Claims, 10 Drawing Sheets

(51) Int. Cl.

| | | |
|---|---|---|
| *G02F 1/1362* | (2006.01) | |
| *G06F 3/041* | (2006.01) | |
| *H10D 86/40* | (2025.01) | |
| *H10K 59/131* | (2023.01) | |
| *H10K 59/88* | (2023.01) | |
| *H10W 42/60* | (2026.01) | |

(52) U.S. Cl.
CPC ......... *H10D 86/441* (2025.01); *H10D 86/443* (2025.01); *H10K 59/131* (2023.02); *H10K 59/88* (2023.02); *H10W 42/60* (2026.01); *G06F 3/0412* (2013.01)

(56) References Cited

FOREIGN PATENT DOCUMENTS

| | | | | |
|---|---|---|---|---|
| CN | 108681415 A | * | 10/2018 | ........... G06F 3/0412 |
| CN | 109188801 A | | 1/2019 | |
| CN | 113990199 A | | 1/2022 | |
| CN | 115172428 A | | 10/2022 | |
| WO | 2022204877 A1 | | 6/2022 | |

* cited by examiner

ARRAY SUBSTRATE, DISPLAY PANEL AND MANUFACTURING METHOD THEREOF

TECHNICAL FIELD

Embodiments of the present disclosure relate to an array substrate, a display panel, and a manufacturing method thereof.

BACKGROUND

With the increase of the charging rate and refresh frequency of a display device, such as a liquid crystal display device, in the case where the display device is driven by a single-side source, the RC loading of signal lines will increase greatly in the process of transmitting signals, which will affect the uniformity of display image quality. In order to meet the demands of high image quality products, it is necessary to use double-side sources to drive, which is helpful to reduce the difference of charging rate in the display device.

SUMMARY

Embodiments of the present disclosure provides an array substrate, a display panel and a manufacturing method thereof.

An embodiment of the present disclosure provides an array substrate, which includes a display region and a peripheral region located at a periphery of the display region, the array substrate includes: a plurality of data lines, a plurality of gate lines, a gate driving structure, a plurality of gate driving signal lines, and a data fanout wiring region. The plurality of data lines is located at least in the display region, and the plurality of data lines is arranged along a first direction; the plurality of gate lines is located at least in the display region, the plurality of gate lines is arranged along a second direction, and the second direction intersects with the first direction; the gate driving structure is located in the peripheral region and at at least one side of the display region in the first direction, the gate driving structure is configured to be electrically connected with the plurality of gate lines; the plurality of gate driving signal lines is located in the peripheral region and electrically connected with the gate driving structure; the data fanout wiring region is located in the peripheral region, wires in the data fanout wiring region are configured to be electrically connected with the plurality of data lines. The array substrate further includes a dummy fanout wiring region, a dummy pad region and a bended line located in the peripheral region, the data fanout wiring region and the dummy fanout wiring region are located at both sides of the display region in the second direction, the plurality of data lines is electrically connected with first pads in the dummy pad region through the wires in the dummy fanout wiring region, and at least part of the bended line is located at one side of the dummy pad region away from the gate driving structure; the plurality of gate driving signal lines includes a first gate driving signal line portion and a second gate driving signal line portion which are respectively located at both sides of the gate driving structure in the second direction, the dummy pad region is located at one side of the second gate driving signal line portion away from the gate driving structure, and the second gate driving signal line portion is electrically connected with a second pad in the dummy pad region; a plurality of transmission lines is disposed at one side of the gate driving structure away from the display region, and at least one transmission line and the bended line are electrically connected with a same third pad in the dummy pad region.

For example, according to an embodiment of the present disclosure, the at least one transmission line includes at least one of the group consisting of a ground line, a first common signal transmission line, a common signal feedback line, a start signal line and a test signal line.

For example, according to an embodiment of the present disclosure, the array substrate further includes: an electrostatic discharge structure, located in the peripheral region, the electrostatic discharge structure includes a first electrostatic discharge structure and a second electrostatic discharge structure located at both sides of the display region in the second direction, the first electrostatic discharge structure is located between the data fanout wiring region and the display region. The at least one transmission line includes the first common signal transmission line, the bended line includes a first common signal transmission bended line electrically connected with the first common signal transmission line, and the dummy fanout wiring region is located between the first common signal transmission bended line and the second electrostatic discharge structure.

For example, according to an embodiment of the present disclosure, the data fanout wiring region and the dummy fanout wiring region are distributed approximately symmetrically with respect to a center line of the display region extending in the first direction.

For example, according to an embodiment of the present disclosure, the at least one transmission line includes the start signal line, and the bended line includes a start signal bended line; a start signal connecting line is disposed at one side of the second gate driving signal line portion away from the start signal line, the start signal line is electrically connected with the start signal connecting line through the start signal bended line, and the start signal connecting line is electrically connected with the gate driving structure.

For example, according to an embodiment of the present disclosure, the at least one transmission line includes the test signal line, and the bended line includes a test signal bended line; a test signal connecting line is disposed at one side of the second gate driving signal line portion away from the test signal line, the test signal line is electrically connected with the test signal connecting line through the test signal bended line, and the test signal connecting line is electrically connected with the second electrostatic discharge structure.

For example, according to an embodiment of the present disclosure, the at least one transmission line includes the common signal feedback line, and the bended line includes a common signal feedback bended line; a common signal feedback connecting line is disposed at one side of the second gate driving signal line portion away from the common signal feedback line, the common signal feedback line is electrically connected with the common signal feedback connecting line through the common signal feedback bended line, and the common signal feedback connecting line is electrically connected with a first common signal transmission connecting line.

For example, according to an embodiment of the present disclosure, the at least one transmission line includes the ground line, and the bended line includes a ground bended line; a ground connecting line is disposed at one side, away from the ground line, of the dummy fanout wiring region closest to the gate driving signal line, and the ground line is electrically connected with the ground connecting line through the ground bended line.

For example, according to an embodiment of the present disclosure, a count of bended lines is multiple, and a distance between one of the bended lines closest to the display region and an edge of the array substrate immediately adjacent to the bended line is in a range of 0.3-3 mm.

For example, according to an embodiment of the present disclosure, signal input ends of the plurality of transmission lines, the first gate driving signal line portion and the wires in the data fanout wiring region are all electrically connected with pads in a signal pad region.

For example, according to an embodiment of the present disclosure, the signal pad region and the dummy pad region are distributed approximately symmetrically with respect to a center line of the display region extending in the first direction.

For example, according to an embodiment of the present disclosure, the at least one transmission line includes the common signal feedback line and the start signal line, the bended line includes a common signal feedback bended line and a start signal bended line, the common signal feedback line is electrically connected with a common signal feedback connecting line through the common signal feedback bended line, and the start signal line is electrically connected with a start signal connecting line through the start signal bended line; the array substrate further includes a second common signal transmission line located in the peripheral region, the common signal feedback connecting line is disposed between the second common signal transmission line and the second gate driving signal line portion, and a dummy wire is disposed between the second common signal transmission line and the first gate driving signal line portion.

For example, according to an embodiment of the present disclosure, a count of data fanout wiring regions is multiple, and a plurality of data fanout wiring regions are arranged along the first direction; a count of dummy fanout wiring regions is multiple, a plurality of dummy fanout wiring regions are arranged along the first direction, and the plurality of data fanout wiring regions are arranged in one-to-one correspondence with the plurality of dummy fanout wiring regions.

An embodiment of the present disclosure provides a display panel, which includes any array substrate as mentioned above, the display panel further includes a circuit board; signal input ends of the plurality of transmission lines, the first gate driving signal line portion and the wires in the data fanout wiring region are all electrically connected with pads in a signal pad region so as to be electrically connected with the circuit board, and the signal pad region is located at one side of the display region away from the dummy pad region.

For example, according to an embodiment of the present disclosure, the display panel further includes an opposing substrate opposite to the array substrate and a first frame sealant located between the array substrate and the opposing substrate, the first frame sealant is disposed in the peripheral region, in a direction perpendicular to the array substrate, at least part of pads in the dummy pad region overlap with the first frame sealant.

For example, according to an embodiment of the present disclosure, the display panel further includes a second frame sealant located between the array substrate and the opposing substrate, the second frame sealant is located between the first frame sealant and the display region, and a first gap is disposed between the first frame sealant and the second frame sealant.

For example, according to an embodiment of the present disclosure, the display panel further includes: a black matrix, located at one side of the opposing substrate facing the array substrate, the black matrix includes a first black matrix overlapping with the first frame sealant and a second black matrix overlapping with the second frame sealant, a second gap is disposed between the first black matrix and the second black matrix, and the second gap is smaller than the first gap.

An embodiment of the present disclosure provides an array substrate, which includes a display region and a peripheral region located at a periphery of the display region, the array substrate includes a plurality of data lines, a plurality of gate lines, a gate driving structure, a plurality of gate driving signal lines, a first data fanout wiring region, and a second data fanout wiring region. The plurality of data lines is located at least in the display region, and the plurality of data lines is arranged along a first direction; the plurality of gate lines is located at least in the display region, the plurality of gate lines is arranged along a second direction, and the second direction intersects with the first direction; the gate driving structure is located in the peripheral region and at at least one side of the display region in the first direction, the gate driving structure is configured to be electrically connected with the plurality of gate lines; the plurality of gate driving signal lines is located in the peripheral region and electrically connected with the gate driving structure, the plurality of gate driving signal lines includes a first gate driving signal line portion and a second gate driving signal line portion which are respectively located at both sides of the gate driving structure in the second direction; the first data fanout wiring region is located in the peripheral region, wires in the first data fanout wiring region are configured to be electrically connected with the plurality of data lines; the second data fanout wiring region is located in the peripheral region, wires in the second data fanout wiring region are configured to be electrically connected with the plurality of data lines, and the first data fanout wiring region and the second data fanout wiring region are located in the peripheral region on opposite sides, respectively. The array substrate further includes a common signal transmission line located between the display region and the gate driving structure, one end of the common signal transmission line is electrically connected with a pad close to the first gate driving signal line portion, and the other end of the common signal transmission line is electrically connected with a pad close to the second gate driving signal line portion, a count of pads between the common signal transmission line and the first gate driving signal line portion is a first number, a count of pads between the common signal transmission line and the second gate driving signal line portion is a second number, and the first number is the same as the second number.

For example, according to an embodiment of the present disclosure, a plurality of wires are disposed between the common signal transmission line and the gate driving signal line; at least one wire among the plurality of wires is only located between the common signal transmission line and the second gate driving signal line portion, and one end of the at least one wire is configured to be bonded to a circuit board so as to transmit a corresponding signal, and/or, both ends of at least one wire among the plurality of wires are connected with the pads, one end of the at least one wire located between the common signal transmission line and the second gate driving signal line portion is configured to be bonded to a circuit board so as to transmit a corresponding signal, and the other end of the at least one wire located between the common signal transmission line and the first gate driving signal line portion is transmitted with a ground signal or without any signal, and/or, at least one wire among the plurality of wires is only located between the common signal transmission line and the first gate driving signal line portion, and one end of the at least one wire is transmitted with a ground signal or without any signal.

For example, according to an embodiment of the present disclosure, a plurality of wires are disposed between the common signal transmission line and the gate driving signal line; a position where the common signal transmission line is connected to transmit a common signal in the display region is located in a middle region of the display region in the second direction, the plurality of wires includes a common signal feedback line, and the common signal feedback line is electrically connected with the common signal transmission line.

For example, according to an embodiment of the present disclosure, the plurality of wires includes a start signal line, and the start signal line is electrically connected with the gate driving structure.

For example, according to an embodiment of the present disclosure, the plurality of wires includes a test signal line.

For example, according to an embodiment of the present disclosure, a part of the plurality of wires close to the first data fanout wiring region includes three dummy wires.

For example, according to an embodiment of the present disclosure, at least three ground lines or at least three dummy lines are disposed at one side of the gate driving structure away from the display region.

An embodiment of the present disclosure provides a display panel, which includes the array substrate as mentioned above, the display panel further includes a first circuit board and a second circuit board. The array substrate includes a first signal pad region and a second signal pad region, the first signal pad region and the first data fanout wiring region are located at a same side of the display region, and the second signal pad region and the second data fanout wiring region are located at a same side of the display region; the wires in the first data fanout wiring region and the first gate driving signal line portion are electrically connected with pads in the first signal pad region so as to be electrically connected with the first circuit board, and the wires in the second data fanout wiring region and the second gate driving signal line portion are electrically connected with pads in the second signal pad region so as to be electrically connected with the second circuit board.

For example, according to an embodiment of the present disclosure, the display panel further includes an opposing substrate opposite to the array substrate, in a direction perpendicular to the array substrate, the opposing substrate does not overlap with at least part of the second signal pad region.

An embodiment of the present disclosure provides an manufacturing method of an array substrate, which includes providing the array substrate as mentioned above; cutting the bended line so that only a portion, electrically connected with the third pad and extending in the second direction, of the bended line is retained.

An embodiment of the present disclosure provides an manufacturing method of a display panel, which includes: providing the array substrate as mentioned above; providing an opposing substrate; cell assembling the array substrate and the opposing substrate; cutting off a portion of the opposing substrate covering the dummy pad region in the array substrate so as to expose the dummy pad region; cutting the bended line in the array substrate so that only a portion, electrically connected with the third pad and extending in the second direction, of the bended line is retained.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the present disclosure and thus are not limitative of the present disclosure.

DETAILED DESCRIPTION

Figure 1:
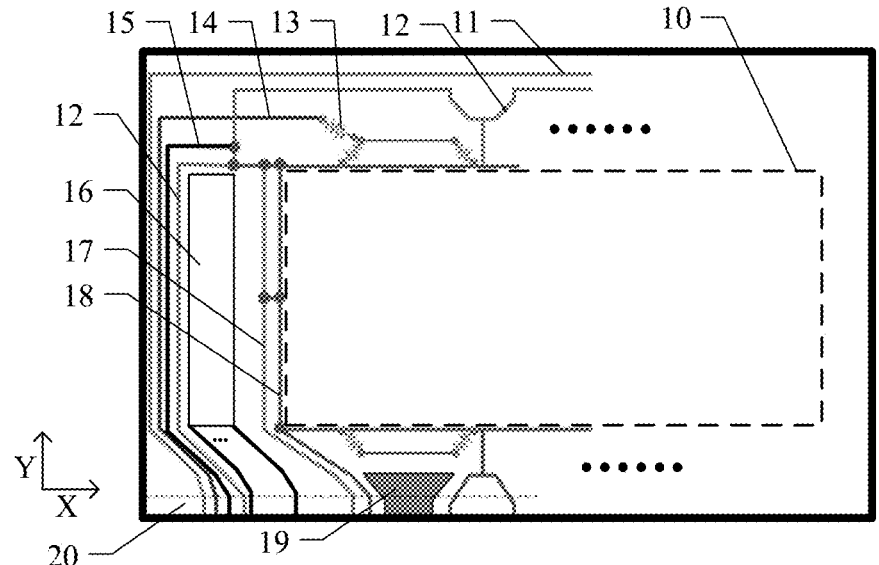
FIG. 1 is a partial structural view of an array substrate driven by a single-side source.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. In the embodiment of the present disclosure, the features, "parallel to," "perpendicular to," "identical to," etc., all include the features "parallel to," "perpendicular to," "identical to," etc., in the strict sense, as well as the cases containing certain errors, such as "approximately parallel to," "approximately perpendicular to," "approximately identical to," etc. Considering the measurement and the errors related to the measurement of a specific quantity (e.g., the limitation of the measurement system), they are within an acceptable deviation range for the specific quantity determined by those skilled in the art. For example, the term "approximately" can mean within one or more standard deviations, or within 10% or 5% deviation of the stated value. When the quantity of a component is not specified in the following description of the embodiments of the present disclosure, it means that the number of the components can be one or more, or can be understood as at least one. The phrase "at least one" means one or more, and the phrase "plurality of" means at least two. The feature "in the same layer" in the present disclosure refers to that two (or more than two) structures are formed by patterning through the same deposition process and the same patterning process, and they can have the same or different materials.

With the increase of the charging rate and refresh frequency of liquid crystal display (LCD) products, e.g., from 8K resolution to 16K resolution, e.g., from 60 Hz refresh frequency to 120 Hz refresh frequency, the RC Loading of signal lines in the display panel is greatly increased, while the charging time for each row of pixels is less and less. In the case where the display panel adopts a source driver, for example, when a signal is input to one end of the signal line to realize single-side driving and a clock (CLK) signal is only output from one side of the display panel, there may be a problem of significant differences in the charging rate of the panel's in-plane heavy loads. In the horizontal (H) direction, one end of the display panel away from the gate driving structure is called a far end (including the middle part of the display panel), and one end of the display panel close to the gate driving structure is called a near end. For example, the gate signal delay (gate delay) of the far end of the display panel is relatively large; in order to prevent the wrong charging of the far end, when the Gate Output Enable (GOE) is set according to the gate delay of the far end of the display panel, the charging rate of the far end can meet the product requirements, while a problem of insufficient charging may occur to the near end of the display panel due to small gate delay and large GOE. In the vertical (V) direction, in the case where the display panel is driven by a single-side source, the difference of RC Loading in data lines is also relatively large, and the data signal delay (data delay) is small and the charging rate is high at the near end of the display panel close to the source driver, while the data delay is large and the charging rate is low at the far end of the display panel away from the source driver. In single-side source driver products with large display panel size and high resolution and refresh frequency, such as 85-inch, 90-inch, 100-inch, 110-inch and other large-sized products, taking 16K resolution as an example, the charging rate difference between the far and near ends in the V direction or H direction is in the range of 10%-15%, which seriously affects the uniformity of image quality in the display screen. In the case where the pixels in the display panel are arranged in an array structure along the row direction and the column direction, only the region with severe gray-scale transition is affected by the charging difference in a normal picture; while the product resolution is high, and the charging difference has little influence on the overall image quality. However, under a heavy-load picture (the gray-scale difference between data signals in adjacent rows or columns is large, for example, the gray-scale difference is greater than 100 gray-scale), the uniformity of image quality is greatly affected. In order to meet the demands of high image quality products, the design of a double-side source driver is needed. In the double-side driving design of bilateral drive, the load in the gate line and data line is halved, which greatly reduces the charging rate difference in the display panel.

FIG. 1 is a partial structural view of an array substrate driven by a single-side source. As shown in FIG. 1, the array substrate includes a display region 10 and a peripheral region surrounding the display region 10. A ground line (GND) 11, a common electrode line 18, a first common signal transmission line 17, a second common signal transmission line 12, an electrostatic discharge unit 13, a test signal line (such as an addition line, ADD) 14, a common signal feedback line 15, a gate driving circuit (GOA) 16 and a data fanout wiring region 19 are disposed in the peripheral region. A pad region 20 is disposed in the peripheral region, a plurality of pads are disposed in the pad region 20, and the above signal lines are electrically connected with a circuit board through the pads. Data lines, gate lines and a plurality of pixels are disposed in the display region 10.

As shown in FIG. 1, the data signal of the array substrate is input into the data line through the data fanout wiring region 19 by only the circuit board (e.g., COF) disposed at one side of the display panel, and at least one circuit board located at the outermost edge in the X direction provides clock signals (CLK) for a plurality of clock signal lines connected with the gate driving circuit 16. Only the ground line 11 and the second common signal transmission line 12 are provided in the peripheral region located at one side of the display region 10 away from the data fanout wiring region 19 in the Y direction, and the ground line 11 and the second common signal transmission line 12 are disposed around the display region 10 except for the data fanout wiring region 19.

As shown in FIG. 1, the edge of the display region 10 close to the pad region 20 is called a near end, the edge of the display region 10 away from the pad region 20 is called a far end, and the middle region of the display region 10 is called a middle end. The array substrate includes a circle of common electrode line surrounding the display region 10, and the common electrode line is configured to be electrically connected with the common electrode of the sub-pixels in the display region 10. The first common signal transmission line 17 is electrically connected with a part of the common electrode line 18 located at the middle end of the display region 10, the second common signal transmission line 12 is electrically connected with a part of the common electrode line 18 located at the far end of the display region 10, and the common signal feedback line 15 is connected with the second common signal transmission line 12 to feedback back the far-end signal. The display panel further includes a frame start signal line (STV1), and the frame start signal line is configured to provide a frame start signal for the gate driving circuit 16 and is connected with the circuit structures of the first few rows of the gate driving circuit 16 away from the pad region 20; Herein, the first few rows can be the first row or the first multiple rows, which is not limited here.

Figure 2:
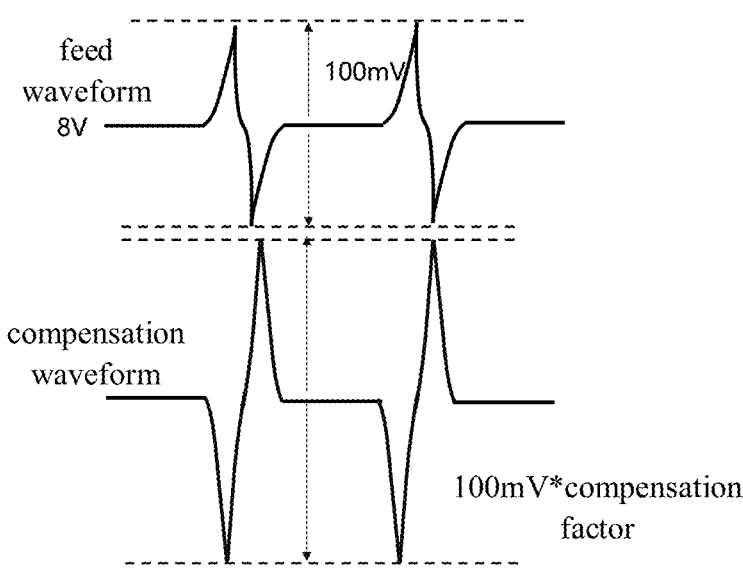
FIG. 2 is a schematic diagram of feedback and compensation waveforms of a common electrode signal in an array substrate.

FIG. 2 is a schematic diagram of feedback and compensation waveforms of a common electrode signal in the array substrate. As shown in FIGS. 1 and 2, the common signal feedback line 15 feeds back the waveform of the common signal at the far end of the display region 10 in real time, and a feedback waveform is as shown in FIG. 2. In the case where the common signal feedback line 15 detects that the waveform of the common signal at the far end of the display region 10 fluctuates greatly, the common signal in the display region 10 can be compensated by a common compensation signal line to maintain the common voltage required for normal display. In the case where the waveform of the common signal at the far end is detected to fluctuate upwards relative to the voltage of the balance point of the common signal, a compensation method adopts reverse complementation, and when a compensation signal acts on the above waveform, the upward fluctuation can be pulled back to the balance point.

For example, as shown in FIG. 2, the voltage of the balance point of the common signal can be 8V. When the feedback waveform has a peak, such as a peak with a peak value of 100 mV, the compensation waveform inputs a reverse peak accordingly, so as to realize reverse complementation. For example, the peak value of the reverse peak is 100 mV*compensation factor, so as to maintain the common voltage in the display region at the voltage of the balance point of the common signal, such as 8V. The voltage of the balance point of the common signal can be set as needed.

Figure 3:
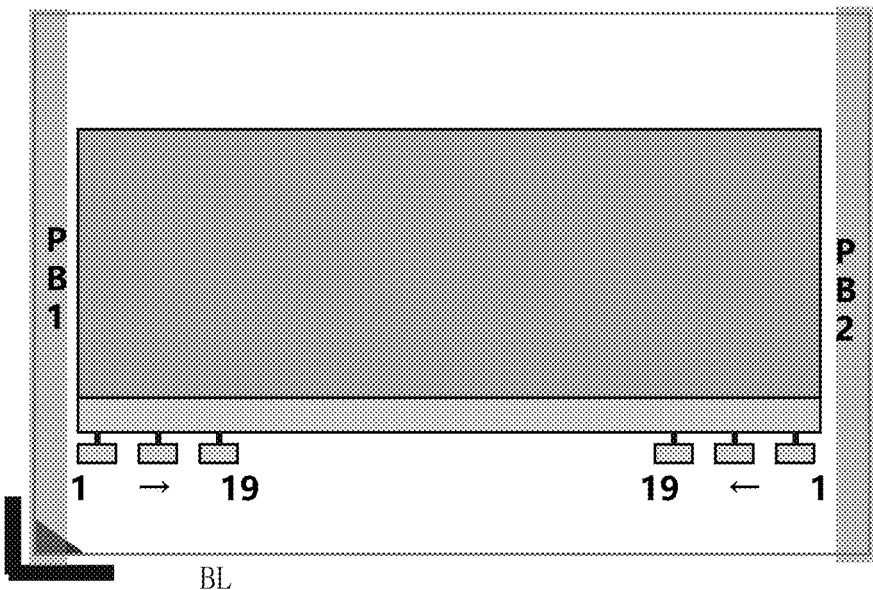
FIG. 3 is a schematic diagram of performing a single-side source driving test on an array substrate.
Figure 4:
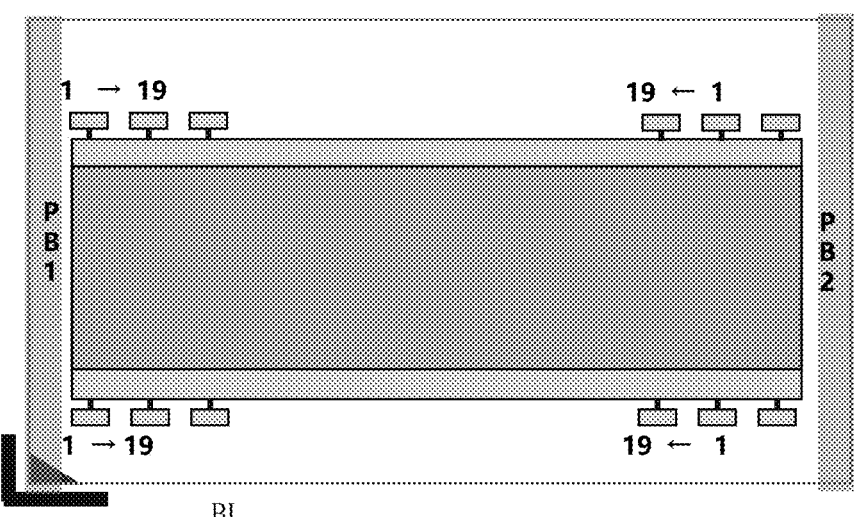
FIG. 4 is a schematic diagram of performing a double-side source driving test on an array substrate.

FIG. 3 is a schematic diagram of performing a single-side source driving test on an array substrate. FIG. 4 is a schematic diagram of performing a double-side source driving test on an array substrate. As shown in FIGS. 3 and 4, after the array substrate is manufactured, the Array Test (AT) equipment loads the signals needed to drive the array substrate from AT Pads, simulates liquid crystal display by optics and electricity, converts the voltage difference between defective and normal pixels into light intensity difference, and then outputs image signals via photoelectric conversion and searches for defects. 38 AT Pads are shown in FIGS. 3 and 4, including 19 AT Pads on the left and 19 AT Pads on the right. Taking the 19 AT Pads on the left as an example, the 1st AT Pad is connected with a signal test line (ADD), the 2nd AT Pad is connected with a frame start signal line STV1, and the 3rd to 10th AT pads are connected with 16 clock signal lines (CLK) respectively, wherein each AT Pad is connected with two clock signal lines, such as CLK odd-even merging to save space. The 11th to 13th AT Pads are connected with power lines VDDO, VDDE, LVGL/VGL, where VDDO, VDDE, LVGL/VGL all provide signals for the gate driving circuit (GOA); the 14th AT Pad is connected with a frame start signal line STV0, the 15th AT Pad is connected with a common signal line, and the 16th to 19th AT Pads are connected with data lines. Data line open (DO) at the edge, for example, due to the influence of leakage current, is difficult to be detected. Detection of DO can be enhanced by adding the signal test line (ADD). For example, after the array substrate is tested, the AT Pads can be cut off, and the signal lines are electrically connected with a subsequently installed circuit board, such as a flexible printed circuit board, to receive electrical signals. For example, FIGS. 3 and 4 illustratively show the positions of probe bars (PB), such as PB1 and PB2, and PB is used for placing an Array Test probe module thereon; BL is a Base Line for positioning the direction of the base substrate (e.g., Glass).

In research, the inventor(s) of the present application have noticed that it is difficult to change the single-side source driving mode to the double-side source driving mode when the array substrate driven by a single-side source as shown in FIG. 1 has poor image quality uniformity in the testing stage, thus resulting in the factory products unable to meet the display requirements of users.

The embodiments of the disclosure provide an array substrate, a display panel and a manufacturing method thereof. The array substrate includes a display region and a peripheral region located at the periphery of the display region, and the array substrate includes a plurality of data lines and a plurality of gate lines located at least in the display region, as well as a gate driving structure, a plurality of gate driving signal lines and a data fanout wiring region located in the peripheral region. The plurality of data lines is arranged along a first direction; the plurality of gate lines is arranged along a second direction, and the second direction intersects with the first direction; the gate driving structure is located at at least one side of the display region in the first direction, and the gate driving structure is configured to be electrically connected with the plurality of gate lines; the plurality of gate driving signal lines is electrically connected with the gate driving structure; and wires in the data fanout wiring region are configured to be electrically connected with the plurality of data lines. The array substrate further includes a dummy fanout wiring region, a dummy pad region and a bended line located in the peripheral region, the data fanout wiring region and the dummy fanout wiring region are located at both sides of the display region in the second direction, the plurality of data lines is electrically connected with first pads in the dummy pad region through the wires in the dummy fanout wiring region, and at least part of the bended line is located at one side of the dummy pad region away from the gate driving structure; the plurality of gate driving signal lines includes a first gate driving signal line portion and a second gate driving signal line portion which are respectively located at both sides of the gate driving structure in the second direction, the dummy pad region is located at one side of the second gate driving signal line portion away from the gate driving structure, and the second gate driving signal line portion is electrically connected with a second pad in the dummy pad region; a plurality of transmission lines is disposed at one side of the gate driving structure away from the display region, and at least one transmission line and the bended line are electrically connected with a same third pad in the dummy pad region.

In the array substrate provided by the present disclosure, the dummy fanout wiring region, the dummy pad region and the bended line are arranged, so that the array substrate is compatible with the designs of single-side source driving and double-side source driving, and a set of mask plates can be used for the production of the array substrate with a single-side source driver and the production of the array substrate with a double-side source driver; therefore, the production cost is reduced, and at the same time, it is helpful to improve the uniformity of image quality when the array substrate is used for display, so as to flexibly meet the image quality requirements of users.

The array substrate includes a display region and a peripheral region located at the periphery of the display region, and the array substrate includes a plurality of data lines, a plurality of gate lines, a gate driving structure, a plurality of gate driving signal lines, a first data fanout wiring region and a second data fanout wiring region. The plurality of data lines is located at least in the display region, and the plurality of data lines is arranged along a first direction; the plurality of gate lines is located at least in the display region, the plurality of gate lines is arranged along a second direction, and the second direction intersects with the first direction; the gate driving structure is located in the peripheral region and at at least one side of the display region in the first direction, and the gate driving structure is configured to be electrically connected with the plurality of gate lines; the plurality of gate driving signal lines is located in the peripheral region and electrically connected with the gate driving structure, and the plurality of gate driving signal lines includes a first gate driving signal line portion and a second gate driving signal line portion which are respectively located at both sides of the gate driving structure in the second direction; the first data fanout wiring region is located in the peripheral region, and wires in the first data fanout wiring region are configured to be electrically connected with the plurality of data lines; the second data fanout wiring region is located in the peripheral region, wires in the second data fanout wiring region are configured to be electrically connected with the plurality of data lines, and the first data fanout wiring region and the second data fanout wiring region are located in the peripheral region on opposite sides, respectively. The array substrate further includes a common signal transmission line located between the display region and the gate driving structure, one end of the common signal transmission line is electrically connected with a pad close to the first gate driving signal line portion, the other end of the common signal transmission line is electrically connected with a pad close to the second gate driving signal line portion, the number of pads between the common signal transmission line and the first gate driving signal line portion is a first number, the number of pads between the common signal transmission line and the second gate driving signal line portion is a second number, and the first number is the same as the second number. The array substrate can be compatible with the designs of single-side source driving and double-side source driving, and a set of mask plates can be used for the production of the array substrate with a single-side source driver and the production of the array substrate with a double-side source driver; therefore, the production cost is reduced, the product development schedule is shortened, and at the same time, it is helpful to improve the uniformity of image quality when the array substrate is used for display, so as to flexibly meet the requirements of users for high image quality or normal image quality.

Hereinafter, the array substrate, the display panel and the a manufacturing method provided by the embodiments of the present disclosure will be described with reference to the accompanying drawings.

Figure 5:
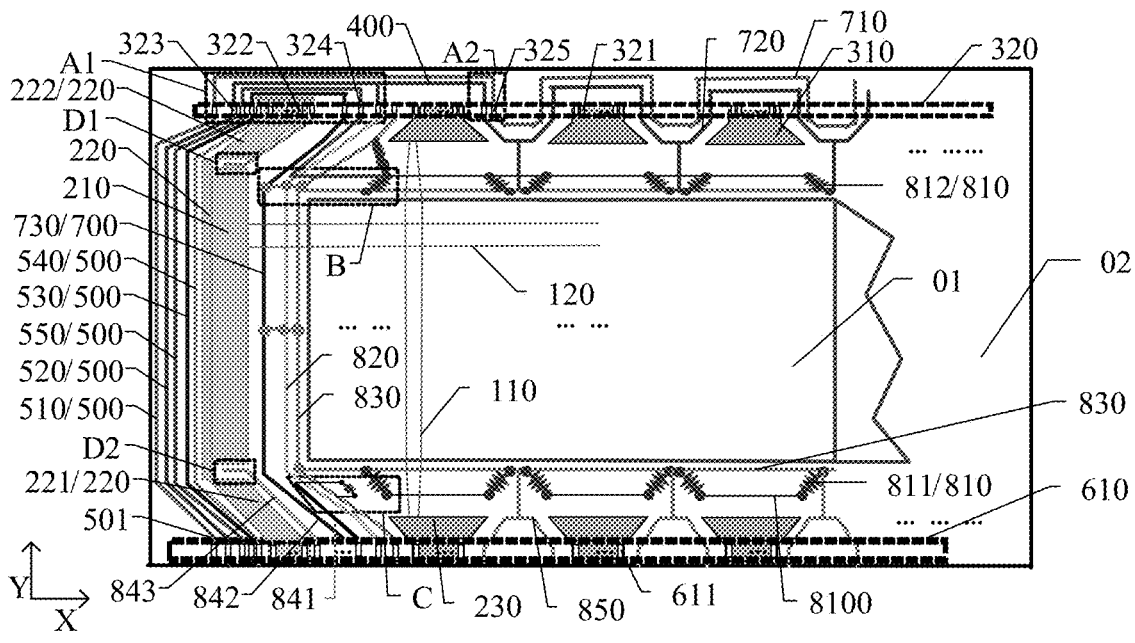
FIG. 5 is a partial planar structural view of an array substrate provided by an embodiment of the present disclosure.
Figure 6:
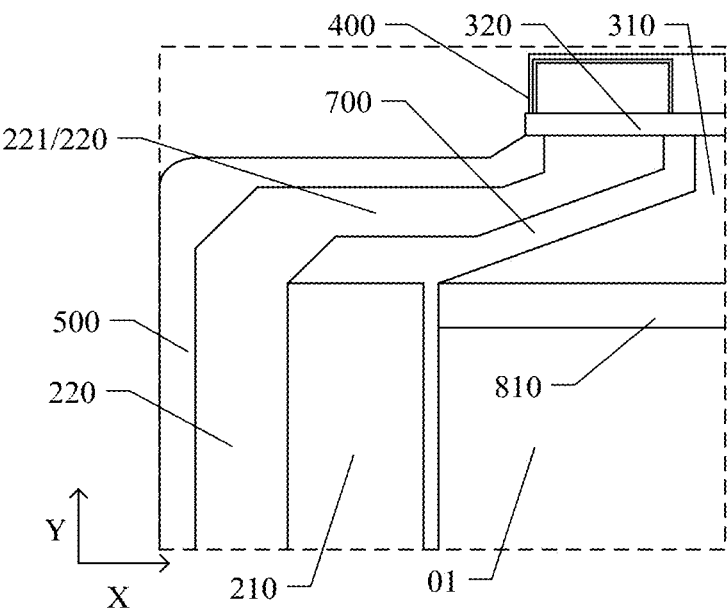
FIG. 6 is a partial structural view of the upper left corner of the array substrate shown in FIG. 5, including a gate driving structure, a gate driving signal line, a transmission line, a bended line, a dummy fanout wiring region and a display region.
Figure 7:
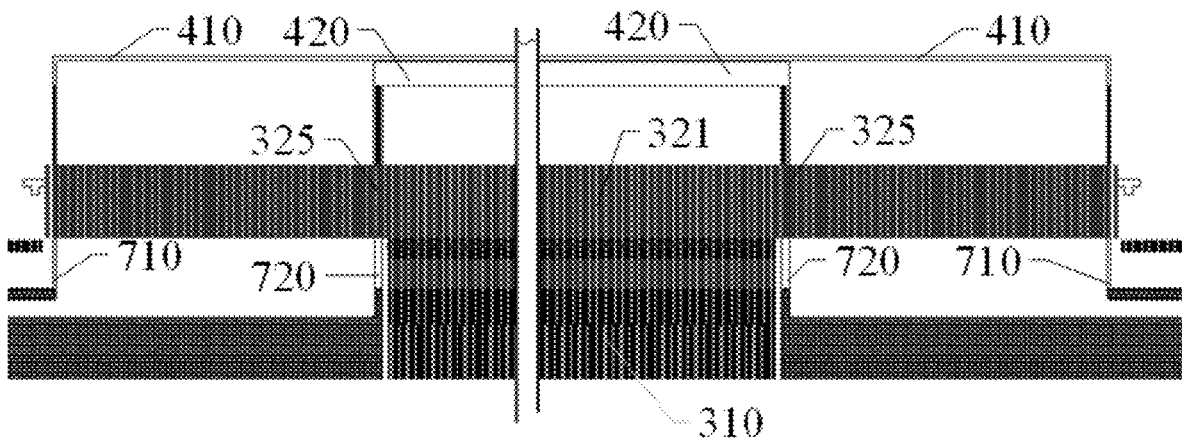
FIG. 7 is a schematic diagram of a dummy pad region in the middle part of the array substrate shown in FIG. 5.
Figure 8:
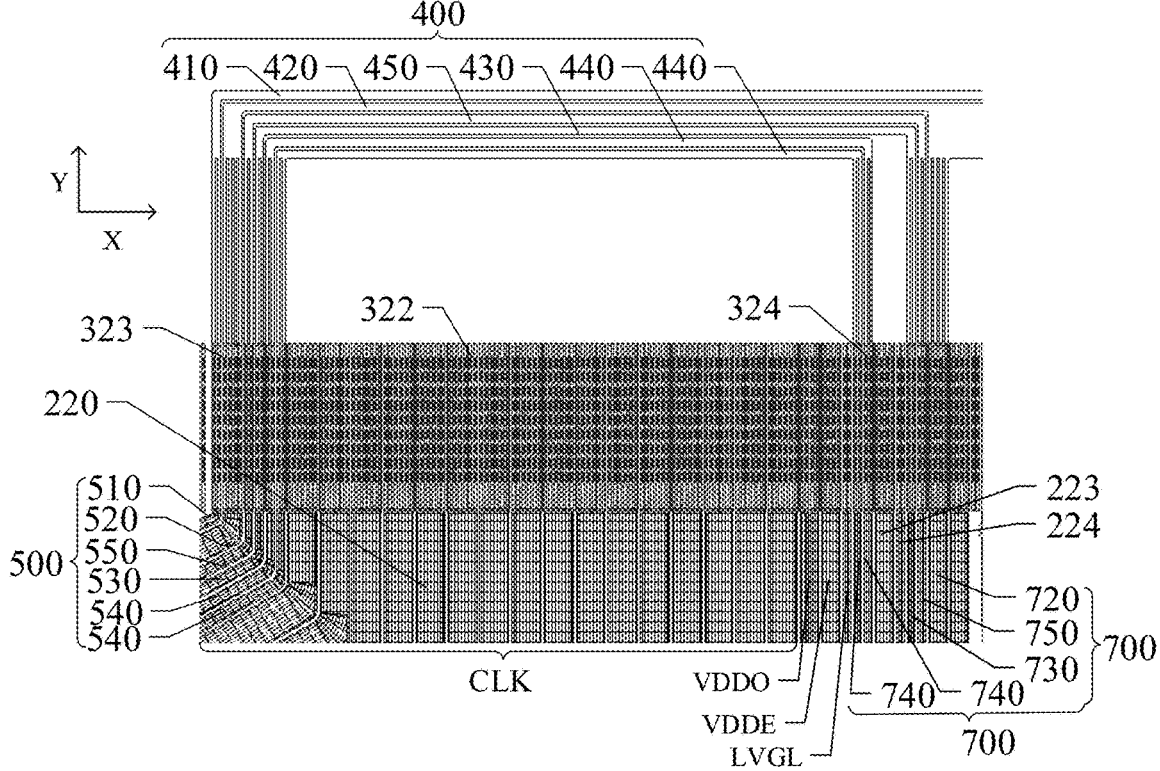
FIG. 8 is a schematic diagram of the structure in the region A1 shown in FIG. 5.
Figure 9:
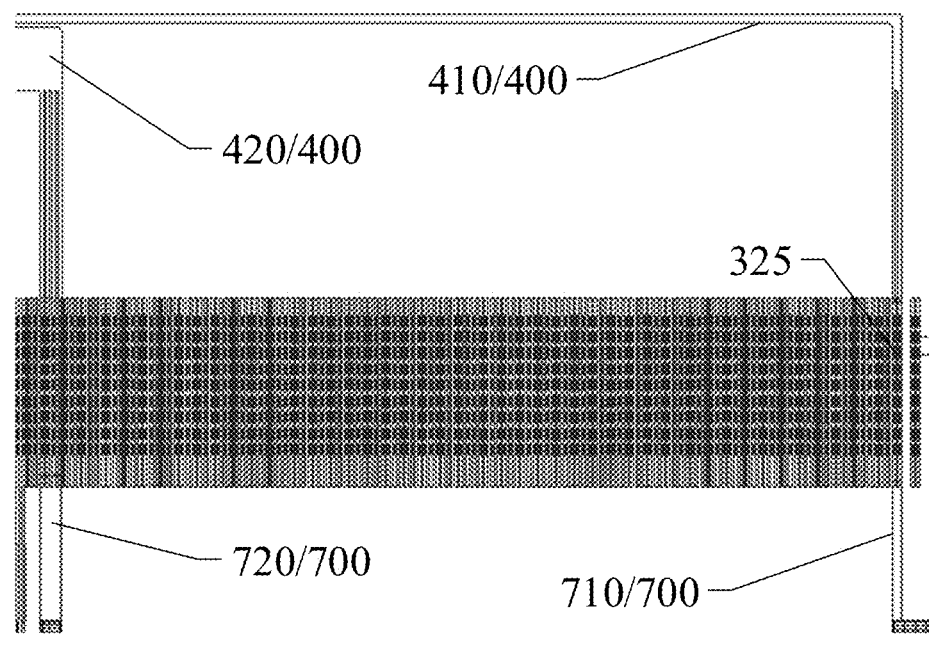
FIG. 9 is a schematic diagram of the structure in the region A2 shown in FIG. 5.
Figure 10:
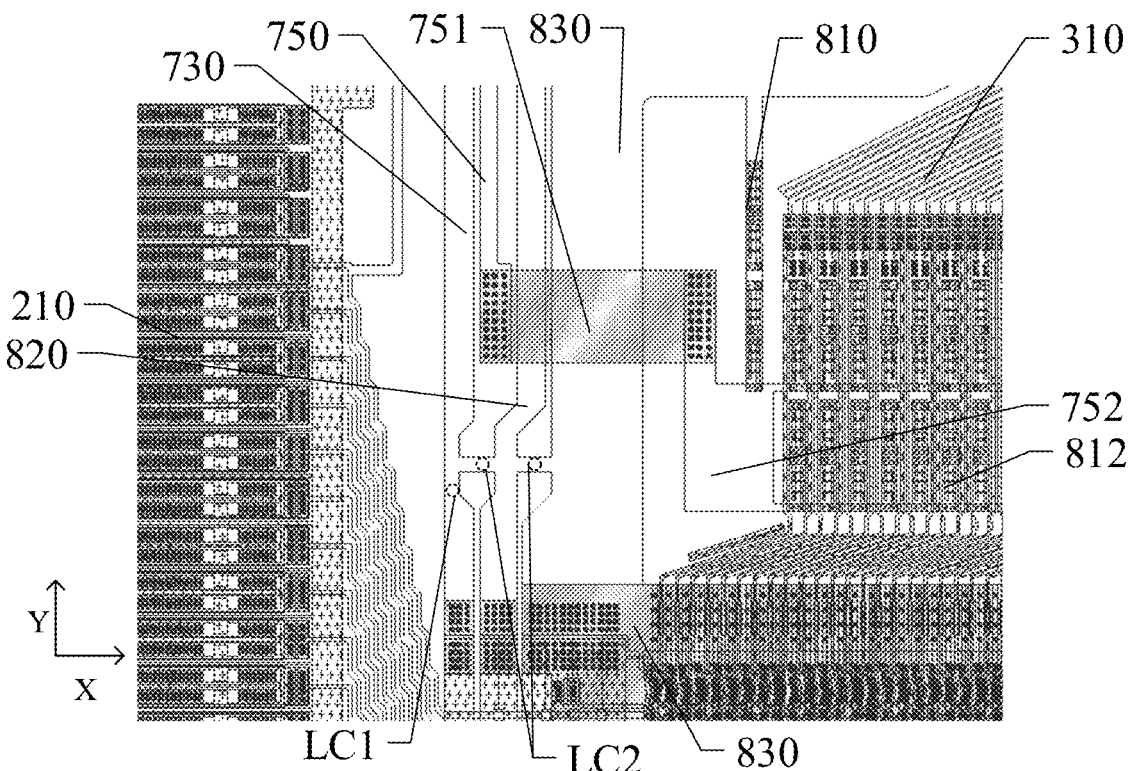
FIG. 10 is a schematic diagram of the structure in the region B shown in FIG. 5.
Figure 11:
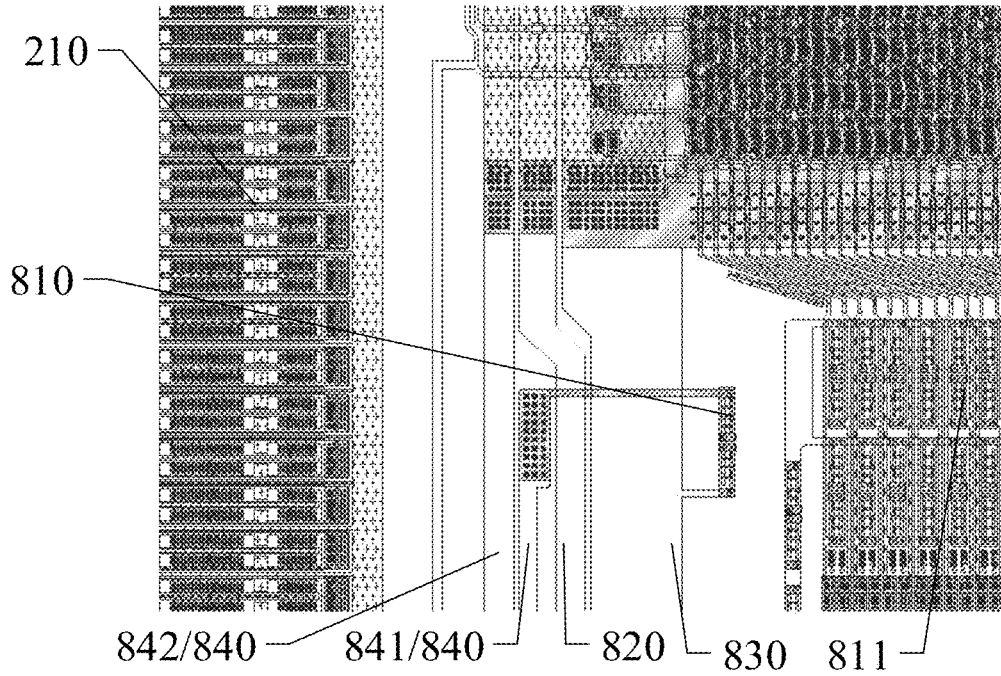
FIG. 11 is a schematic diagram of the structure in the region C shown in FIG. 5.

FIG. 5 is a partial planar structural view of an array substrate provided by an embodiment of the present disclosure. FIG. 6 is a partial structural view of the upper left corner of the array substrate shown in FIG. 5, including a gate driving structure, a gate driving signal line, a transmission line, a bended line, a dummy fanout wiring region and a display region. FIG. 7 is a schematic diagram of a dummy pad region in the middle part of the array substrate shown in FIG. 5. FIG. 8 is a schematic diagram of the structure in the region A1 shown in FIG. 5. FIG. 9 is a schematic diagram of the structure in the region A2 shown in FIG. 5. FIG. 10 is a schematic diagram of the structure in the region B shown in FIG. 5. FIG. 11 is a schematic diagram of the structure in the region C shown in FIG. 5.

As shown in FIG. 5, the array substrate includes a display region 01 and a peripheral region 02 located at the periphery of the display region 01. For example, the display region 01 can be completely surrounded by the peripheral region 02, or a part of the display region 01 can be surrounded by the peripheral region 02. For example, the display region 01 is a region used for displaying image, for example, including pixels for displaying image; the peripheral region 02 is a region not used for displaying image.

As shown in FIGS. 5, 6, 10 and 11, the array substrate includes a plurality of data lines 110 located at least in the display region 01, a plurality of gate lines 120 located at least in the display region 01, a gate driving structure 210 located in the peripheral region 02, a plurality of gate driving signal lines 220 located in the peripheral region 02 and a data fanout wiring region 230 located in the peripheral region 02. The plurality of data lines 110 is arranged along a first direction, the plurality of gate lines 120 is arranged along a second direction, and the second direction intersects with the first direction. FIG. 5 illustratively shows that the first direction is the X direction, the second direction is the Y direction, and the first direction is perpendicular to the second direction. But not limited thereto, the included angle between the first direction and the second direction can be in the range of 80-120 degrees, such as 89-92 degrees, such as 95-100 degrees, etc. The first direction and the second direction can be interchanged. For example, at least part of the data lines 110 extend along the second direction and at least part of the gate lines 120 extend along the first direction.

As shown in FIGS. 5 and 11, the gate driving structure 210 is located at at least one side of the display region 01 in the first direction, and the gate driving structure 210 is configured to be electrically connected with the plurality of gate lines 120. For example, the gate driving structure 210 can include a plurality of stages of gate driving circuits (e.g., Gate driven On Array, GOA), which are cascaded with each other. Each stage of gate driving circuit includes an input circuit, an output circuit and a reset circuit, and each circuit includes at least one transistor. In the present application, the gate driving structure 210 can refer to the position provided with the plurality of transistors in the plurality of stages of gate driving circuits. For example, the number of the gate driving structures 210 can be one, and the one gate driving structure 210 is located at one side of the display region 01 in the first direction; the number of the gate driving structures 210 can also be two, and the two gate driving structures 210 are located at both sides of the display region 01 in the first direction.

As shown in FIGS. 5 and 6, the plurality of gate driving signal lines 220 is electrically connected with the gate driving structure 210. For example, the plurality of gate driving signal lines 220 includes a power line, a clock signal lines, etc. For example, the gate driving signal line 220 is electrically connected with a transistor in the gate driving structure 210.

For example, as shown in FIG. 8, the plurality of gate driving signal lines 220 arranged along the X direction sequentially includes 16 clock signal lines CLK (it should be noted that 16 clock signal lines are taken as an example here, and other numbers of clock signal lines may be provided, such as 8, 10, 12, etc., without being limited here), three power signal lines VDDO, VDDE (it should be noted that, only VDDO or VDDE may be provided here, that is, VDDO or VDDE is configured to provide a signal to a pull-down module of the gate driving circuit) and LVGL (configured to provide a noise reduction signal to the gate driving circuit), a frame start signal line STV0, a power line 223 (VGL) and an output signal line 224 (GOUT).

As shown in FIGS. 5 and 11, the wires in the data fanout wiring region 230 are configured to be electrically connected with the plurality of data lines 110. It should be noted that the electrical connection here can mean that the wires in the data fanout wiring region 230 are directly connected with the plurality of data lines 110, or that other components or jumpers are disposed therebetween to realize electrical connection; and for example, structures, such as electrostatic discharge (ESD) circuits or other transistors, etc., can be further arranged therebetween. For example, the wires in the data fanout wiring region 230 are only electrically connected with the data lines 110. For example, the array substrate can include a plurality of data fanout wiring region 230, and the plurality of data fanout wiring region 230 is arranged along the first direction. For example, the plurality of data fanout wiring regions 230 is located at the same side of the display region 01 in the second direction.

As shown in FIGS. 5 to 10, the array substrate further includes a dummy fanout wiring region 310, a dummy pad region 320 and a bended line 400 located in the peripheral region 02. For example, the dummy fanout wiring region 310, the dummy pad region 320 and the wiring 400 are all located at the same side of the display region 01 in the second direction.

As shown in FIG. 5, the data fanout wiring region 230 and the dummy fanout wiring region 310 are located at both sides of the display region 01 in the second direction, and the plurality of data lines 110 is electrically connected with first pads 321 in the dummy pad region 320 through the wires in the dummy fanout wiring region 310. For example, the wires in the dummy fanout wiring region 310 are electrically connected with the data lines 110. For example, the dummy pad region 320 includes a plurality of first pads 321, and all of the plurality of first pads are electrically connected with the data lines 110.

As shown in FIG. 5, at least part of the bended line 400 is located at one side of the dummy pad region 320 away from the gate driving structure 210. For example, the bended line 400 includes a portion extending along the first direction, and this portion is located at one side of the dummy pad region 320 away from the gate driving structure 210. For example, the bended line 400, the gate driving signal lines 220 and the gate lines 120 are structures arranged in the same layer. For example, the bended line 400 further includes two portions extending along the second direction, and these two portions are located at both sides of the portion, extending along the first direction, of the bended line 400.

As shown in FIG. 5, the plurality of gate driving signal lines 220 includes a first gate driving signal line portion 221 and a second gate driving signal line portion 222 which are respectively located at both sides of the gate driving structure 210 in the second direction, and the dummy pad region 320 is located at one side of the second gate driving signal line portion 222 away from the gate driving structure 210. For example, the first gate driving signal line portion 221 and the data fanout wiring region 230 are located at the same side of the display region 01 in the second direction. For example, taking one gate driving signal line 220 as an example, one portion of the gate driving signal line 220 is located in the first gate driving signal line portion 221, and another portion of the gate driving signal line 220 is located in the second gate driving signal line portion 222, that is, the signal line in the first gate driving signal line portion and the signal line in the second gate driving signal line portion are two portions of the same signal line.

FIGS. 5 and 6 illustratively show the gate driving structure 210 in one frame, the plurality of gate driving signal lines 220 is electrically connected with respective circuits in the gate driving structure 210, and then wound from one side of the gate driving structure 210 away from the display region 01 to both sides of the gate driving structure 210, so as to form the first gate driving signal line portion 221 and the second gate driving signal line portion 222 at both sides of the gate driving structure 210.

As shown in FIG. 5, the second gate driving signal line portion 222 is electrically connected with a second pad 322 in the dummy pad region 320. For example, the dummy pad region 320 includes a plurality of second pads 322, and the plurality of second pads 322 is only electrically connected with the second gate driving signal line portions 222.

As shown in FIG. 5, a plurality of transmission lines 500 is disposed at one side of the gate driving structure 210 away from the display region 01, and at least one transmission line 500 is electrically connected with the bended line 400 through a third pad 323 in the dummy pad region 320. For example, the dummy pad region 320 includes a plurality of third pads 323, and the plurality of third pads 323 is only electrically connected with the transmission lines 500. For example, the transmission lines 500 are located at one side of the gate driving signal line 220 away from the display region 01.

In the array substrate provided by the present disclosure, by setting the dummy fanout wiring region, the dummy pad region and the bended line, the array substrate can be compatible with the designs of single-side source driving and double-side source driving, and a set of mask plates can be used for the production of the array substrate with a single-side source driver and the production of the array substrate with a double-side source driver; therefore, the production cost is reduced, the product development schedule is shortened, and at the same time, it is helpful to improve the uniformity of image quality when the array substrate is used for display, so as to flexibly meet the requirements of users for high image quality or normal image quality.

The array substrate provided by the present disclosure can be applied to a display device with super-large size, ultra-high resolution (e.g., 16K) and high refresh rate. The array substrate can be applied to a 16K resolution (e.g., the resolution is 15360*8640) display device that uses oxide as the active layer. Optionally, the transistors included in the display region or the transistors included in the gate driving circuit at least partially use oxide as the semiconductor layer, so as to improve the charging rate of the large-sized panel. Of course, it is not limited to oxide, but also amorphous silicon or low-temperature polysilicon can be used as the semiconductor layer.

In some examples, as shown in FIG. 5, the signal input ends 501 of the plurality of transmission lines 500, the signal lines in the first gate driving signal line portions 221, and the wires in the data fanout wiring region 230 are all electrically connected with the pads 611 in the signal pad region 610.

For example, the pads 611 in the signal pad region 610 are configured to be bonded with a circuit board, so that the circuit board can provide signals for transmission lines, gate driving signal lines and data lines. Optionally, the circuit board can be a flexible printed circuit board (FPC) or a printed circuit board (PCB), etc., which is not limited here.

In some examples, as shown in FIG. 5, the signal pad region 610 and the dummy pad region 320 are located at both sides of the display region 01 in the second direction, and the signal pad region 610 and the dummy pad region 320 are distributed approximately symmetrically with respect to the center line of the display region 01 extending in the first direction.

For example, two regions with the same shape and area are selected in the array substrate, a straight line extending in the second direction passes through the center points of these two regions, and these two regions have the same distance from two edges of the array substrate extending in the first direction; these two regions include part of the signal pad region and part of the dummy pad region, respectively, and for example, these two regions include a first region and a second region, and the part of the signal pad region included in the first region is symmetrically distributed with the part of the dummy pad region included in the second region.

For example, a dummy pad region and a dummy fanout wiring region connected with the data lines are reserved on one side of the array substrate away from the data fanout wiring region, and a bended line is reserved at one side of the gate driving signal line away from the gate driving structure. In the case where the pads 611 in the signal pad region 610 are electrically connected with the circuit board and the pads in the dummy pad region 320 are not electrically connected with the circuit board, the array substrate can be driven by a single-side source. In the case where the pads in the signal pad region and the pads in the dummy pad region are both electrically connected with the circuit board, the array substrate can be an array substrate driven by a double-side source. Therefore, the array substrate is compatible with the designs of single-side source driving and double-side source driving, and a set of mask plates can be used for the production of the array substrate with a single-side source driver and the production of the array substrate with a double-side source driver.

Before the display device adopting the array substrate provided by the present disclosure leaves the factory, assuming that it is found through testing that the load of the data line is too large to meet the requirements of uniformity of image quality, the pads in the dummy pad region can be electrically connected with the circuit board to enable the array substrate to adopt a double-side source driver design, thereby improving the uniformity of image quality without affecting the product production schedule, being helpful to reduce the cost, and improving the display quality of the display panel.

In some examples, as shown in FIGS. 5 and 8, at least one transmission line 500 includes at least one of the group consisting of a ground line 510, a first common signal transmission line 520, a common signal feedback line 530, a start signal line 540 and a test signal line 550. For example, the array substrate includes a plurality of transmission lines 500, and the plurality of transmission lines 500 includes at least two of the group consisting of the ground line 510, the first common signal transmission line 520, the common signal feedback line 530, the start signal line 540 (the start signal line is configured to provide an initial driving signal for the gate driving circuit, e.g., to provide an start signal for the input end of the gate driving circuit) and a test signal line 550. For example, the plurality of transmission lines 500 includes at least three of the group consisting of the ground line 510, the first common signal transmission line 520, the common signal feedback line 530, the start signal line 540 and the test signal line 550. For example, the plurality of transmission lines 500 includes at least four of the group consisting of the ground line 510, the first common signal transmission line 520, the common signal feedback line 530, the start signal line 540 or the test signal line 550. For example, the plurality of transmission lines 500 includes the ground line 510, the first common signal transmission line 520, the common signal feedback line 530, the start signal line 540 and the test signal line 550.

For example, as shown in FIG. 8, the numbers of the ground line 510, the first common signal transmission line 520, the common signal feedback line 530 and the test signal line 550 included in the transmission lines 500 can all be one, and the number of the start signal lines 540 included in the transmission lines 500 can be two, e.g., STV1_O (a start signal line electrically connected with a circuit of an odd-numbered row in the gate driving structure) and STV1_E (a start signal line electrically connected with a circuit of an even-numbered row in the gate driving structure). The embodiment of the present disclosure is not limited to thereto, and the number of the start signal lines 540 can be one.

In the case where the array substrate shown in FIG. 5 is provided with two gate driving structures, the gate driving structure and transmission lines on the other side can be symmetrically arranged with the structures shown in FIG. 5.

For example, as shown in FIG. 8, along the X direction, the ground line 510, the first common signal transmission line 520, the test signal line 550, the common signal feedback line 530 and the start signal line 540 are arranged in sequence, and the ground line 510 is located at one side of the start signal line 540 away from the display region 01.

For example, as shown in FIG. 5, the display region 01 can be divided into a near end, a middle end and a far end according to the distance from the data fanout wiring region 230. The near end is a region of the display region 01 close to the data fanout wiring region 230, and the far end is a region of the display region 01 away from the data fanout wiring region 230, and the middle end is located between the near end and the far end. The array substrate further includes a common electrode line 830 at least partially surrounding the display region 01. Optionally, the common electrode line 830 is arranged around the display panel in a circle. Here, the common electrode line arranged around in a circle can be arranged in the same layer, or in different layers but eventually electrically connected together, or in the same layer or in different layers but finally connected together through components (e.g., transistors or like structures). A plurality of sub-pixels is arranged in the display region 01, each sub-pixel includes a pixel electrode and a common electrode, and the common electrode line is configured to be electrically connected with the common electrode. The first common signal transmission line 520 is electrically connected with a portion of the common electrode line 830 located at the far end of the display region 01, and the common signal feedback line 530 is connected with the first common signal transmission line 520 to feedback back the far-end signal of the display region 01. For example, in the case where the common signal feedback line 530 detects that the waveform of the common signal at the far end of the display region 01 fluctuates greatly, the common signal in the display region 01 can be compensated by a common compensation signal line to maintain the common voltage required for normal display. In the case where the waveform of the common signal at the far end is detected to fluctuate upwards relative to the voltage of a balance point of the common signal, a compensation method adopts reverse complementation, and when a compensation signal acts on the above waveform, the upward fluctuation can be pulled back to the balance point.

For example, as shown in FIG. 5, the start signal line 540 can be a frame start signal line (STV1) electrically connected with a circuit in the gate driving structure 210, so as to input a frame start signal to the gate driving structure 210.

For example, as shown in FIG. 5, the test signal line 550 can be an ADD signal line used during Array Test (AT) after the array substrate is manufactured.

For example, as shown in FIG. 5, the first gate driving signal line portion 221 and the second gate driving signal line portion 222 are distributed approximately symmetrically with respect to the center line of the display region 01 extending in the first direction. For example, at least one transmission line 500 is approximately symmetrically distributed with respect to the center line of the display region 01 extending in the first direction. For example, signal lines, such as transmission lines and gate driving signal lines, etc., located at one side of the gate driving structure 210 away from the display region 01 are approximately symmetrically distributed with respect to the center line of the display region 01 extending in the first direction. Here, the approximately symmetrical distribution can be completely symmetrical distribution, or the included angle between at least a partial signal line included in the first gate driving signal line portion and the second direction is the same ("same" refers to within a certain measurement error range, such as a testing error range of ±5°) as the included angle between at least a partial signal line included in the second gate driving signal line portion and the second direction. "Approximately symmetrical" means that, for example, the signal line extension directions of the bending portions at both ends of a transmission line are the same, and for example, the bending extension directions are the same, optionally, the bending directions are the same, and optionally, they are completely symmetrically distributed. The above-mentioned "approximately symmetrical" can be applied to the case of approximately symmetrical components in each embodiment.

In some examples, as shown in FIG. 5, the data fanout wiring region 230 and the dummy fanout wiring region 310 are distributed approximately symmetrically with respect to the center line of the display region 01 extending in the first direction.

For example, two regions with the same shape and area are selected on the array substrate, a straight line extending in the second direction passes through the center points of these two regions, and these two regions have the same distance from two edges of the array substrate extending in the first direction; these two regions include part of the data fanout wiring region and part of the dummy fanout wiring region, respectively, and for example, these two regions include a first region and a second region, and the part of the data fanout wiring region included in the first region is symmetrically distributed with the part of the dummy fanout wiring region included in the second region.

In some examples, as shown in FIG. 5, the number of data fanout wiring regions 230 is multiple, and the multiple data fanout wiring regions 230 are arranged along the first direction; the number of dummy fanout wiring regions 310 is multiple, the multiple dummy fanout wiring regions 310 are arranged along the first direction, and the multiple data fanout wiring regions 230 are arranged in one-to-one correspondence with the multiple dummy fanout wiring regions 310. For example, the data fanout wiring region 230 and the dummy fanout wiring region 310 connected with the same data line 110 are arranged correspondingly.

For example, as shown in FIGS. 5-10, the array substrate further includes at least one transmission connecting line 700, and at least one transmission line 500 is connected with the at least one transmission connecting line 700 through the bended line 400. For example, the number of transmission lines 500 is multiple, the number of transmission connecting lines 700 is multiple, the number of bended lines 400 is multiple, and each transmission line 500 can be connected to one corresponding transmission connecting line 700 through one bended line 400.

In some examples, as shown in FIGS. 5, 6 and 8, the dummy pad region 320 includes a fourth pad 324, and the third pad 323 and the fourth pad 324 are located at both sides of the second pad 322. For example, the fourth pad 324 is located between the second pad 322 and the first pad 321.

For example, as shown in FIGS. 5, 6 and 8, the transmission line 500 is connected with the bended line 400 through the third pad 323, and the bended line 400 is connected with the transmission connecting line 700 through the fourth pad 324.

For example, as shown in FIG. 8, the transmission line 500, the bended line 400 and the transmission connecting line 700 can be structures arranged in the same layer, e.g., in the same layer as the gate line. For example, the transmission line 500, the bended line 400 connected with the transmission line 500, and the transmission connecting line 700 connected with the bended line 400 can be an integrated structure; the pad includes a portion of the bended line 400 extending in the second direction and another film layer stacked with this portion, and this film layer and this portion of the bended line 400 are electrically connected through a via in an insulating layer between this film layer and the bended line 400.

In some examples, as shown in FIGS. 5, 8 and 9, the bended lines 400 include a ground bended line 410, a first common signal transmission bended line 420, a test signal bended line 450, a common signal feedback bended line 430 and a start signal bended line 440. The transmission connecting lines 700 include a ground connecting line 710, a first common signal transmission connecting line 720, a test signal connecting line 750, a common signal feedback connecting line 730, and a start signal connecting line 740.

In some examples, as shown in FIGS. 5, 8 and 9, the ground connecting line 710, the first common signal transmission connecting line 720, the test signal connecting line 750, the common signal feedback connecting line 730, and the start signal connecting line 740 are all located at one side of the gate driving signal line 220 away from the transmission line 500. For example, the start signal connecting line 740 is disposed at one side of the second gate driving signal line portion 222 away from the start signal line 540. For example, the test signal connecting line 750 is disposed at one side of the second gate driving signal line portion 222 away from the test signal line 550. For example, the common signal feedback connecting line 730 is disposed at one side of the second gate driving signal line portion 222 away from the common signal feedback line 530.

In some examples, as shown in FIGS. 5, 8 and 9, the start signal line 540 is electrically connected with the start signal bended line 440 through the third pad 323, and the start signal bended line 440 is electrically connected with the start signal connecting line 740 through the fourth pad 324. For example, the start signal line 540, the start signal bended line

440 and the start signal connecting line 740 are structures arranged in the same layer, e.g., in the same layer as the gate line. For example, the start signal line 540, the start signal bended line 440 and the start signal connecting line 740 can be an integrated structure. For example, the test signal line 550 is electrically connected with the test signal bended line 450 through the third pad 323, and the test signal bended line 450 is electrically connected with the test signal connecting line 450 through the fourth pad 324. For example, the common signal feedback line 530 is electrically connected with the common signal feedback bended line 430 through the third pad 323, and the common signal feedback bended line 430 is electrically connected with the common signal feedback connecting line 730 through the fourth pad 324.

For example, FIG. 7 illustratively shows the dummy fanout wiring region 310, the ground bended line 410, the first common signal transmission bended line 420, the ground connecting line 710 and the first common signal transmission connecting line 720 located between the dummy fanout wiring regions on both edges.

In some examples, as shown in FIGS. 5, 7 and 9, the dummy pad region 320 includes a fifth pad 325, and the second pad 322 and the fifth pad 325 are located at both sides of the dummy fanout wiring region 310 closest to the gate driving signal line 220 in the first direction, respectively. The ground connecting line 710 is disposed at one side, away from the ground line 510, of the dummy fanout wiring region 310 closest to the gate driving signal line 220, the ground line 510 is electrically connected with the ground bended line 410 through the third pad 323, and the ground bended line 410 is electrically connected with the ground connecting line 710 through the fifth pad 325.

For example, as shown in FIGS. 5 and 7, the number of dummy fanout wiring regions 310 is multiple, and fifth pads 325 are disposed at both sides of a dummy fanout wiring region 310 other than the dummy fanout wiring region 310 closest to the gate driving signal line 220. For example, one side, away from the display region 01, of the dummy fanout wiring region 310 other than the dummy fanout wiring region 310 closest to the gate driving signal line 220, is surrounded by the ground bended line 410 and the ground connecting line 710. For example, one side, away from the display region 01, of the dummy fanout wiring region 310 other than the dummy fanout wiring region 310 closest to the gate driving signal line 220, is surrounded by the first common signal transmission bended line 420 and the first common signal transmission connecting line 720 on the side away from the display region 01. For example, the first common signal transmission connecting lines 720 located at both sides of the dummy fanout wiring region 310 other than the dummy fanout wiring region 310 closest to the gate driving structure 210 can be electrically connected with the common electrode line 830. For example, the first common signal transmission connecting line 720 between the dummy fanout wiring region 310 closest to the gate driving structure 210 and the gate driving structure 210 can be a portion of the second common signal transmission line 820.

For example, as shown in FIG. 5, a common signal connecting line 850 is disposed between adjacent data fanout wiring regions 230, which is configured to electrically connect the common electrode line 830 and the pad 611 in the signal pad region 610 so as to connect the common electrode line 830 to a circuit board, and the circuit board provides a common signal for the common electrode line. For example, the common signal connecting line 850 can also be configured as a signal line for compensating common signals. For example, the common signal connecting line 850 and a portion of the first common signal transmission connecting line 720 are symmetrically distributed with respect to the center line of the display region 01 extending in the first direction.

For example, as shown in FIGS. 5 and 7, the display region 01 is surrounded by the first common signal transmission bended line 420 and the first common signal transmission connecting line 720 on other three sides except the side close to the data fanout wiring region 230. For example, the display region 01 is surrounded by the ground bended line 410 and the ground connecting line 710 on other three sides except the side close to the data fanout wiring region 230.

For example, as shown in FIG. 8, the gate driving signal line 220, the transmission line 500 and the transmission connecting line 700 are arranged in a hollow structure, e.g., including a plurality of openings, so as to facilitate light transmission and curing of the frame sealant; and for example, the cured sealant overlaps with the gate driving signal line 220, the transmission line 500 and the transmission connecting line 700 in the direction perpendicular to the array substrate. For example, a portion of at least one bended line 400 extending in the second direction is provided with a slit to facilitate light transmission and curing of the frame sealant; and for example, the portion of the bended line 400 extending in the second direction overlaps with the frame sealant in the direction perpendicular to the array substrate.

In some examples, as shown in FIGS. 5 and 7-9, the number of bended lines 400 is multiple, and the distance between one of the bended lines 400 closest to the display region 01 and the edge of the array substrate immediately adjacent to the bended lines 400 is in the range of 0.3-3 mm. For example, the multiple bended lines 400 are located at the upper part of the array substrate, and here, the direction indicated by the arrow in the Y direction is upward, and the distance between one of the bended lines 400 closest to the display region 01 and the upper edge of the array substrate is in the range of 0.3-3 mm. For example, the above distance can be in the range of 0.4-2.5 mm. For example, the above distance can be in the range of 0.5-1.5 mm. For example, the above distance can be in the range of 0.8-2 mm. For example, the above distance can be in the range of 1-1.3 mm. For example, the above distance can be in the range of 1.2-1.7 mm. By setting the distance between the above bended line and the upper edge of the array substrate, it is convenient to switch the array substrate from single-side source driving design to double-side source driving design while reducing the upper frame of the array substrate as much as possible.

In some examples, as shown in FIGS. 2, 10 and 11, the array substrate further includes an electrostatic discharge structure 810 located in the peripheral region 02, the electrostatic discharge structure 810 includes a first electrostatic discharge structure 811 and a second electrostatic discharge structure 812 located at both sides of the display region 01 in the second direction, the first electrostatic discharge structure 811 is located between the data fanout wiring region 230 and the display region 01, and the dummy fanout wiring region 310 is located between the first common signal transmission bended line 420 and the second electrostatic discharge structure 812. For example, the dummy fanout wiring region 310 is located at one side of the second electrostatic discharge structure 812 away from the display region 01.

For example, the electrostatic discharge structure 810 includes a plurality of electrostatic discharge units, each electrostatic discharge unit includes a plurality of transistors, and the plurality of transistors is electrically connected. For example, the data line is connected with the wire in the data fanout wiring region through the electrostatic discharge structure, and the data line is connected with the wire in the dummy fanout wiring region through the electrostatic discharge structure. For example, the test signal line is connected with the data line through some of the electrostatic discharge units. For example, the test signal line is connected with the common electrode line through some of the electrostatic discharge units. For example, one electrostatic discharge unit includes four thin film transistors, but not limited thereto, and one electrostatic discharge unit can also include two, three, five, six, seven, eight, nine or more thin film transistors.

In some examples, as shown in FIGS. 5 and 10, the test signal connecting line 750 is electrically connected with the second electrostatic discharge structure 812. For example, the second electrostatic discharge structures corresponding to different dummy fanout wiring regions are all connected with the test signal connecting line 750. For example, the first electrostatic discharge structures corresponding to different data fanout wiring regions are connected with different electrostatic rings 8100.

For example, as shown in FIG. 10, the test signal connecting line 750 includes a portion extending in the second direction, and this portion is disposed in the same layer as the gate line. For example, the test signal connecting line 750 further includes a first connecting portion 751 and a second connecting portion 752, and the first connecting portion 751 is configured to connect the portion of the test signal connecting line 750 extending in the second direction and the second connecting portion 752. For example, the first connecting portion 751 and the portion of the test signal connecting line 750 extending in the second direction are disposed in different layers; for example, the first connecting portion 751 is disposed in the same layer as the pixel electrode or the common electrode, and optionally, an ITO material layer is adopted; the first connecting portion 751 and the test signal line 750 are electrically connected through a plurality of vias, and for example, three columns of vias are disposed in FIG. 10; and the second connecting portion 752 is disposed in the same layer as the portion of the test signal connecting line 750 extending in the second direction. For example, the second connection portion 752 is connected with the second electrostatic discharge structure 812. For example, after the testing of the test signal line is completed, the test signal line is input with a ground signal or not with any electrical signal.

In some examples, as shown in FIGS. 5, 8 and 10, the start signal connecting line 740 is electrically connected with the gate driving structure 210. Optionally, the start signal connecting line is electrically connected with a gate included in the gate driving structure and can be electrically connected with an input transistor of the gate driving circuit, and the input transistor is configured to control the voltage of a pull-up node of the gate driving circuit.

In some examples, as shown in FIGS. 5 and 8, the common signal feedback connecting line 730 is electrically connected with the first common signal transmission connecting line 720.

In some examples, as shown in FIGS. 5 and 10, the array substrate further includes a second common signal transmission line 820 and a common electrode line 830 located in the peripheral region 02. The common electrode line 830 surrounds the display region 01 and is electrically connected with the common electrode of the sub-pixels in the display region 01.

In some examples, as shown in FIGS. 5, 10 and 11, the common signal feedback connecting line 730, the start signal connecting line 740 and the test signal connecting line 750 are disposed between the second common signal transmission line 820 and the second gate driving signal line portion 222, and a dummy wire 840 is disposed between the second common signal transmission line 820 and the first gate driving signal line portion 221.

For example, as shown in FIGS. 10 and 11, the dummy wire 840 includes a first dummy wire 841, and the first dummy wire 841 and a portion of the test signal connecting line 750 are distributed approximately symmetrically with respect to the center line of the display region 01 extending in the first direction. Optionally, in the present application, dummy pads correspondingly connected with the test signal connecting lines 750 are disposed in one-to-one correspondence with pads correspondingly connected with the first dummy wires 841, thus ensuring that the pads at one side of the data fanout wiring region and the pads at one side of the dummy fanout wiring region have identical numbers and/or positions and/or arrangement orders, and which is convenient to be compatible with single-side driving and double-side driving; that is, the circuit board used for single-side driving and the circuit board used for double-side driving can be shared. For example, the first dummy wire 841 is electrically connected with the electrostatic discharge structure 810 and the common electrode line 830 to assist electrostatic discharge.

For example, as shown in FIGS. 5, 10 and 11, a portion of the common signal feedback connecting line 730 close to the signal pad region 610 is not electrically connected with the circuit board, so this portion can be regarded as a second dummy wire 842.

For example, as shown in FIGS. 5 and 10, the common signal feedback connecting line 730 has two connection relationships with the second common signal transmission line 820, one connection relationship is close to the dummy fanout wiring region 310, and the other connection relationship is close to the middle region of the display region 01 in the second direction. For example, in the case where the array substrate is driven by a single-side source, the position of LC1 shown in FIG. 10 is cut by laser, and the common signal feedback connecting line 730 only receives the common signal at the far-end position of the display region 01; in the case where the array substrate is driven by a double-side source, the position of LC2 shown in FIG. 10 is cut by laser, and the common signal feedback connecting line 730 is electrically connected with the second common signal transmission line 820 close to the middle region of the display region 01; in this case, the middle region serves as the far end of the display region, and the common signal feedback connecting line still receives the common signal at the far-end position of the display region. For example, the second common signal transmission line can serve as a transmission line for common signal, and can also transmit a compensation signal when there is a problem with the far-end common signal fed by the common signal feedback line.

For example, the array substrate shown in FIG. 5 is an array substrate driven by a single-side source, and the LC1 position shown in FIG. 10 is disconnected.

Figure 12:
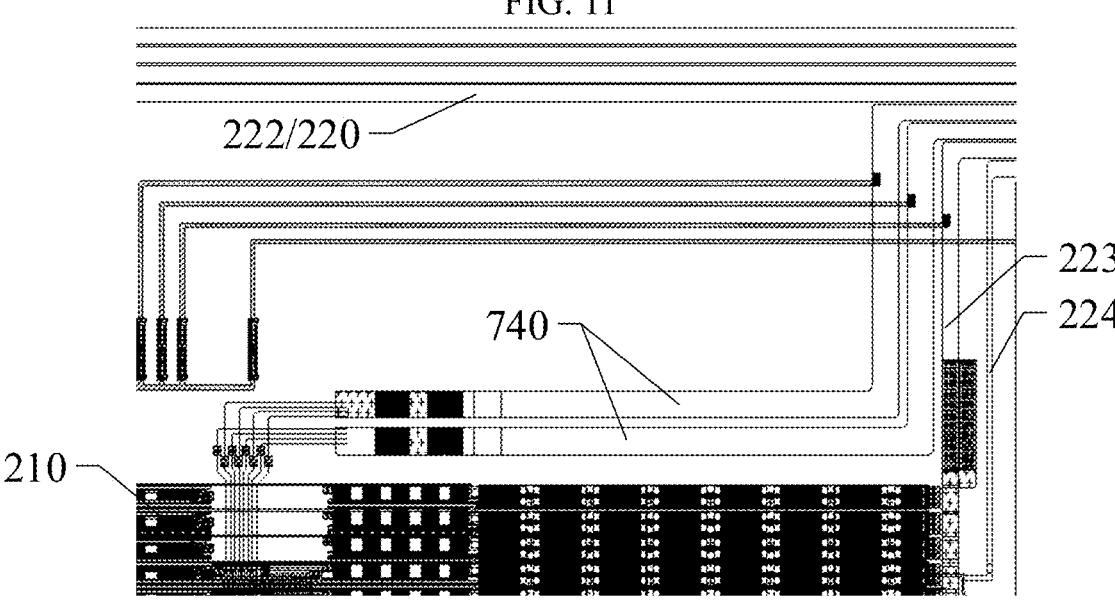
FIG. 12 is a schematic diagram of the structure in the region D1 of the array substrate shown in FIG. 5.
Figure 13:
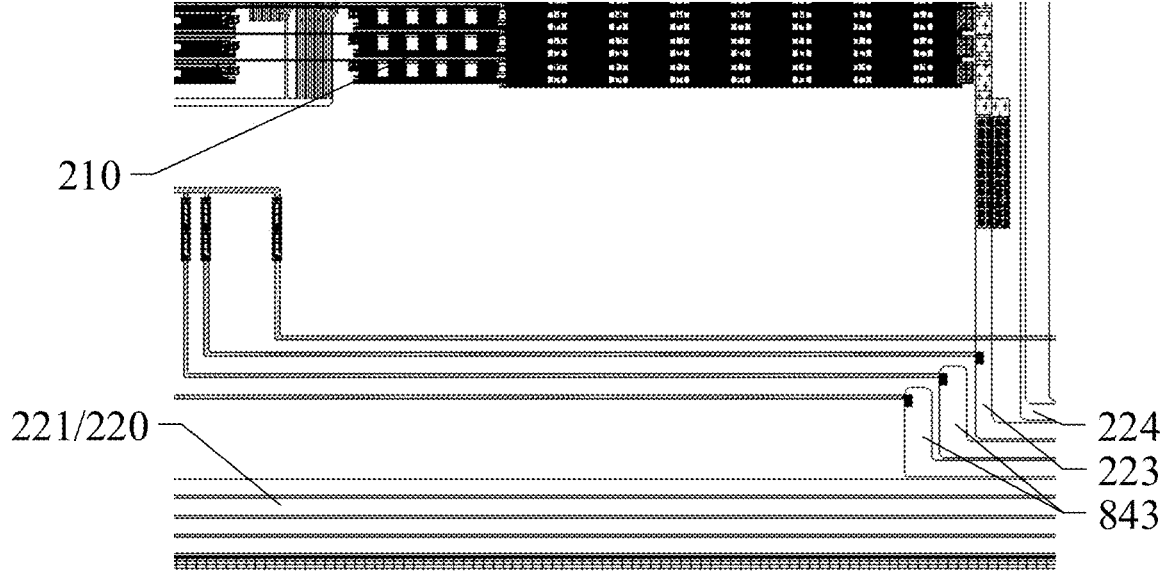
FIG. 13 is a schematic diagram of the structure in the region D2 of the array substrate shown in FIG. 5.

FIG. 12 is a schematic diagram of the structure in the region D1 of the array substrate shown in FIG. 5. FIG. 13 is a schematic diagram of the structure in the region D2 of the array substrate shown in FIG. 5.

For example, as shown in FIGS. 5, 12 and 13, the start signal connecting line 740 includes a portion located between the gate driving structure 210 and the second gate driving signal line portion 222, and this portion is electrically connected with the gate driving structure 210. For example, the dummy wire further includes a third dummy wire 843, the third dummy wire 843 is located between the gate driving structure 210 and the first gate driving signal line portion 221, and the third dummy wire 843 is symmetrically distributed with a portion of the start signal connecting line 740 located between the gate driving structure 210 and the second gate driving signal line portion 222. For example, the third dummy wire 843 is not bonded to the circuit board, or is bonded to the circuit board but not provided with any signal. That is, the pin pad corresponding to the third dummy wire and the dummy pin pad corresponding to the start signal connecting line 740 are accordingly arranged, thus ensuring that the pin pads on the upper and lower sides have corresponding positions and identical numbers, which is convenient to support single-side driving and double-side driving; that is, the circuit board used for single-side driving and the circuit board used for double-side driving can be shared. Here, the included angle between at least part of the third dummy wire and the second direction is the same as the included angle between at least part of the start signal connecting line and the second direction (within a certain error range, e.g., within a range of 5°-10°); and here, the third dummy wire 740 may not be electrically connected with the gate driving circuit, that is, it may be in a floating state optionally.

For example, as shown in FIGS. 12 and 13, the gate driving signal line 220 includes a power line 223 and an output signal line 224; and for example, the power line 223 can be a VGL line and the output signal line 224 can be a GOUT line. For example, the output signal line 224 can be connected with a gate line to transmit a gate signal or a signal for testing gate line to the gate line; for example, the output signal line 224 can further be connected with a pad, and this pad serves as a pin pad for a probe to detect the waveform of the gate line. For example, the gate driving structure of the display panel includes the last-stage gate driving circuit (GOA), the output signal of the output module of the GOA circuit is transmitted to the gate line of the display panel, that is, the output module is electrically connected with the gate line of the display panel; and at the same time, the output module of the last-stage GOA circuit is also connected with the output signal line 224, the output signal line 224 is electrically connected with a pad, and the waveform of the gate line or the output waveform of the GOA circuit can be tested through this pad.

Figure 14:
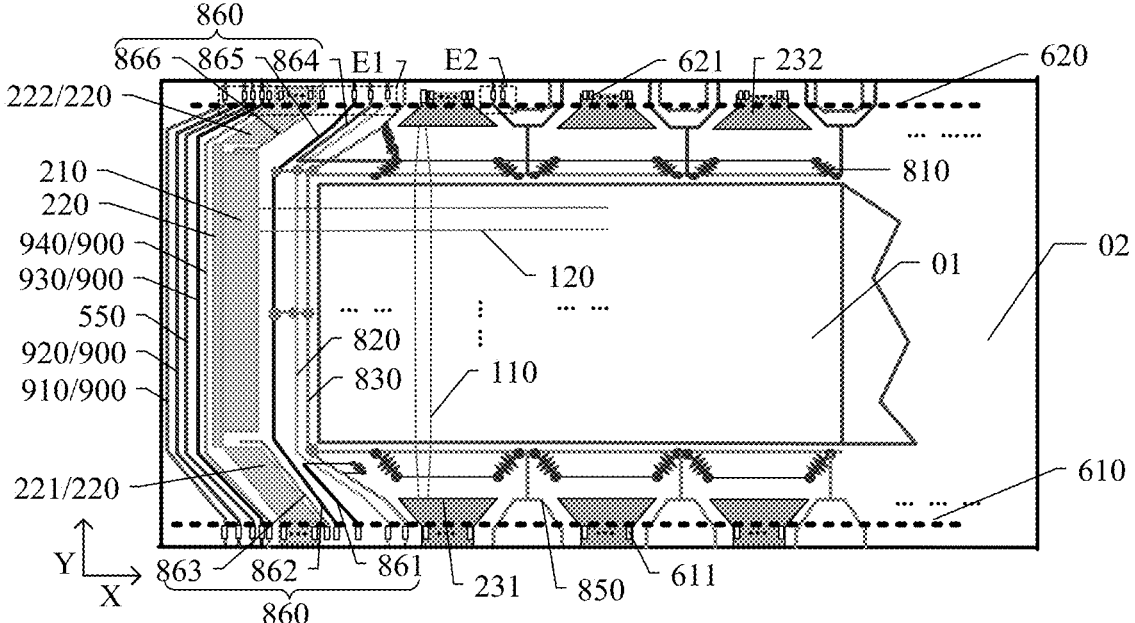
FIG. 14 is a partial planar structural view of an array substrate provided by another embodiment of the present disclosure.
Figure 15:
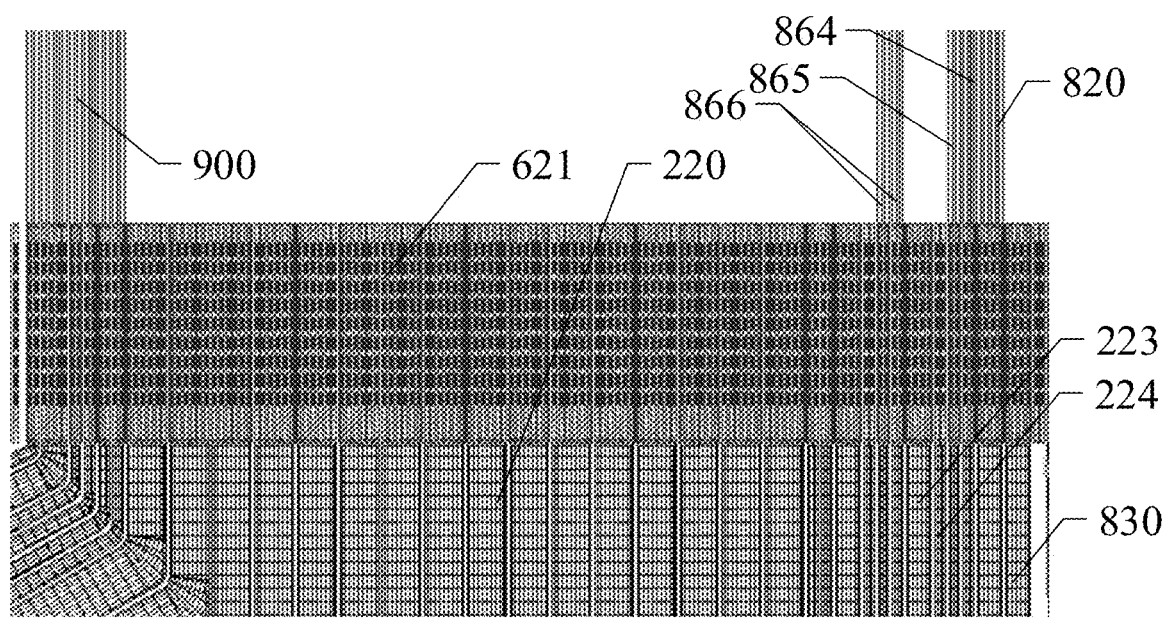
FIG. 15 is a schematic diagram of the structure in the region E1 shown in FIG. 14.
Figure 16:
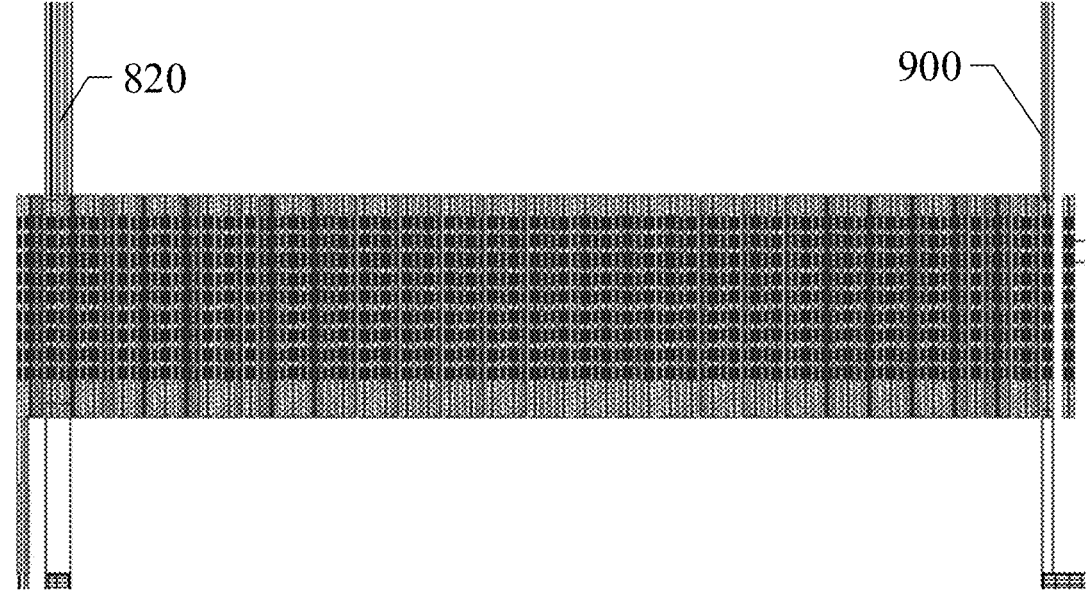
FIG. 16 is a schematic diagram of the structure in the region E2 shown in FIG. 14.

FIG. 14 is a partial planar structural view of an array substrate provided by another embodiment of the present disclosure. FIG. 15 is a schematic diagram of the structure in the region E1 shown in FIG. 14. FIG. 16 is a schematic diagram of the structure in the region E2 shown in FIG. 14.

As shown in FIG. 14, the array substrate includes a display region 01 and a peripheral region 02 located at the periphery of the display region 01. The display region can have the same features as the display region shown in FIG. 5, and details will not be repeated here. The peripheral region on the upper side of the display region 01 in the array substrate shown in FIG. 14 has different features from the peripheral region on the upper side of the display region in the array substrate shown in FIG. 5, and the peripheral regions on the left and right sides and the lower side of the display region 01 in the array substrate shown in FIG. 14 can have the same features as the peripheral regions on the left and right sides and the lower side of the display region 01 in the array substrate shown in FIG. 5.

As shown in FIG. 14, the array substrate includes a plurality of data lines 110 located at least in the display region 01, a plurality of gate lines 120 located at least in the display region 01, a gate driving structure 210 located in the peripheral region 02, and a plurality of gate driving signal lines 220 located in the peripheral region 02. The plurality of data lines 110 is arranged along a first direction, the plurality of gate lines 120 is arranged along a second direction, and the second direction intersects with the first direction. The gate driving structure 210 is located at at least one side of the display region 01 in the first direction, and the gate driving structure 210 is configured to be electrically connected with the plurality of gate lines 120. The plurality of gate driving signal lines 220 is electrically connected with the gate driving structure 210. The plurality of gate driving signal lines 220 includes a first gate driving signal line portion 221 and a second gate driving signal line portion 222 located at both sides of the gate driving structure 210 in the second direction, respectively.

The gate lines, the data lines, the gate driving structure and the gate driving signal lines in the array substrate shown in FIG. 14 can have the same features as the gate lines, the data lines, the gate driving structure and the gate driving signal lines in the array substrate shown in FIG. 5, and details will not be repeated here.

As shown in FIG. 14, the array substrate further includes a first data fanout wiring region 231 and a second data fanout wiring region 232 located in the peripheral region 02. The wires in the first data fanout wiring region 231 are configured to be electrically connected with the plurality of data lines 110; the wires in the second data fanout wiring region 232 are configured to be electrically connected with the plurality of data lines 110, and the first data fanout wiring region 231 and the second data fanout wiring region 232 are respectively located in the peripheral regions on both sides of the display region 01 in the second direction.

For example, as shown in FIG. 14, the first data fanout wiring region 231 and the second data fanout wiring region 232 are respectively located on both sides of the center line of the display region 01 extending in the first direction.

The connection relationship between the first data fanout wiring region 231 and the data line 110 shown in FIG. 14 has the same features as the connection relationship between the data fanout wiring region 230 and the data line 110 shown in FIG. 5, and the connection relationship between the second data fanout wiring region 231 and the data line 110 has the same features as the connection relationship between the dummy fanout wiring region 310 and the data line 110 shown in FIG. 5. The positional relationship between the first data fanout wiring region 231 and the second data fanout wiring region 232 shown in FIG. 14 has the same features as the positional relationship between the data fanout wiring region 230 and the dummy fanout wiring region 310 shown in FIG. 5.

As shown in FIG. 14, the array substrate further includes a common signal transmission line 820 located between the display region 01 and the gate driving structure 210, one end of the common signal transmission line 820 is electrically connected with a pad close to the first gate driving signal line portion 221, and the other end of the common signal transmission line 820 is electrically connected with a pad close to the second gate driving signal line portion 222. The common signal transmission line 820 shown in FIG. 14 has the same features as the second common signal transmission line 820 shown in FIG. 5.

For example, as shown in FIG. 14, the array substrate includes a first signal pad region 610 and a second signal pad region 620, the first signal pad region 610 is a pad region close to the first gate driving signal line portion 221, and the second signal pad region 620 is a pad region close to the second gate driving signal line portion 222. The first signal pad region 610 shown in FIG. 14 has the same features as the signal pad region 610 shown in FIG. 5, and the second signal pad region 620 shown in FIG. 14 has the same features as the dummy pad region 320 shown in FIG. 5. In the case where the array substrate provided by the present disclosure is driven by a single-side source, the design of the array substrate shown in FIG. 5 is adopted, and in this array substrate, only the pads in the signal pad region are bonded to the circuit board, while the pads in the dummy pad region are not bonded to the circuit board; in the case where the array substrate provided by the present disclosure is driven by a double-side source, the design of the array substrate shown in FIG. 14 is adopted, and in this array substrate, the pads in the first signal pad region and the pads in the second signal pad region are both bonded to the circuit board.

As shown in FIG. 14, the number of pads between the common signal transmission line 820 and the first gate driving signal line portion 221 is a first number, the number of pads between the common signal transmission line 820 and the second gate driving signal line portion 222 is a second number, and the first number is the same as the second number. For example, the number of pads in the first signal pad region between the common signal transmission line 820 and the first gate driving signal line portion 221 is the first number, and the number of pads in the second signal pad region between the common signal transmission line 820 and the second gate driving signal line portion 222 is the second number.

In some examples, as shown in FIG. 14, a plurality of wires 860 is disposed between the common signal transmission line 820 and the gate driving signal line 220.

In some examples, as shown in FIG. 14, at least one wire among the plurality of wires 860 is only located between the common signal transmission line 820 and the second gate driving signal line portion 222, and one end of this wire is configured to be bonded to a circuit board so as to be transmit a corresponding signal. For example, this wire 860 can be a test signal line 864 or a start signal line 866.

In some examples, as shown in FIG. 14, both ends of at least one wire among the plurality of wires 860 are connected with the pads, one end, of this wire, located between the common signal transmission line 820 and the second gate driving signal line portion 222 is configured to be bonded to a circuit board so as to transmit a corresponding signal, and the other end, of this wire, located between the common signal transmission line 820 and the first gate driving signal line portion 221 is transmitted with a ground signal or without any signal. For example, a portion of this wire located between the common signal transmission line 820 and the second gate driving signal line portion 222 can be a common signal feedback line 865, and a portion of this wire located between the common signal transmission line 820 and the first gate driving signal line portion 221 can be a dummy wire 862.

In some examples, as shown in FIG. 14, at least one wire among the plurality of wires 860 is only located between the common signal transmission line 820 and the first gate driving signal line portion 221, and one end of this wire is transmitted with a ground signal or without any signal. For example, this wire can be a dummy wire 863.

In the array substrate provided by the present disclosure, only a part, close to one edge of the array substrate, in the wire disposed between the common signal transmission line and the gate driving signal line is configured to be bonded to the circuit board, so that the array substrate can be compatible with the designs of single-side source driving and double-side source driving, and a set of mask plates can be used for the production of the array substrate with a single-side source driver and the production of the array substrate with a double-side source driver; therefore, the production cost is reduced, the product development schedule is shortened, and at the same time, it is helpful to improve the uniformity of image quality when the array substrate is used for display, so as to flexibly meet the requirements of users for high image quality or normal image quality.

The array substrate provided by the present disclosure can be applied to a 16K resolution (e.g., the resolution is 15360*8640) display device using oxide as the active layer, and can also be applied to a display device using a-Si as the active layer with the resolution of 16K and the refresh frequency of 60 Hz.

The main difference between the array substrate shown in FIG. 14 and the array substrate shown in FIG. 5 is that the array substrate shown in FIG. 14 does not include the part of the bended line 400 extending in the first direction as shown in FIG. 5, so that a part of the bended line 400 directly connected with the transmission connecting line serves as a signal line bonded to the circuit board.

In some examples, as shown in FIGS. 14-16, the position where the common signal transmission line 820 accesses the common signal in the display region 01 is located in the middle region of the display region 01 in the second direction, the wires 860 include a common signal feedback line 865, and the common signal feedback line 865 is electrically connected with the common signal transmission line 820. The structures of the region, as shown in FIGS. 10-13, in the array substrate shown in FIG. 5 is applicable for the array substrate shown in FIG. 14. For example, the array substrate shown in FIG. 14 is driven by a double-side source, and the LC2 position shown in FIG. 10 is disconnected.

The common signal feedback line 865 shown in FIG. 14 is different from the common signal feedback line 530, the common signal feedback bended line 430 and the common signal feedback connecting line 730 shown in FIG. 5 in that the common signal feedback line 865 shown in FIG. 14 only includes a part of the common signal feedback bended line 430 extending in the second direction and the common signal feedback connecting line 730 as shown in FIG. 5, while the array substrate shown in FIG. 14 does not include a part of the common signal feedback bended line extending in the first direction as shown in FIG. 5.

For example, as shown in FIGS. 10-16, a portion of the common signal feedback line 865 close to the second gate driving signal line portion 222 is configured to be bonded to a circuit board, and a portion of the common signal feedback line 865 close to the first gate driving signal line portion 221 is not input with a signal, or only with a ground signal, even if it is bonded to the circuit board; that is, the signal is input into the common signal feedback line 865 only from the end of the common signal feedback line 865 close to the second gate driving signal line portion 222. For example, the portion of the common signal feedback line 685 close to the first gate driving signal line portion 221 can be called a dummy wire 862.

In some examples, as shown in FIGS. 10 to 16, the wires 860 include a start signal line 866, and the start signal line 866 is electrically connected with the gate driving structure 210.

The difference between the start signal line 866 shown in FIG. 14 and the start signal line 540, the start signal bended line 440 and the start signal connecting line 740 shown in FIG. 5 is that the start signal line 866 shown in FIG. 14 only includes a part of the start signal bended line 440 extending in the second direction and the start signal connecting line 740 as shown in FIG. 5, while the array substrate shown in FIG. 14 does not include a part of the start signal bended line extending in the first direction as shown in FIG. 5.

For example, as shown in FIGS. 13 and 14, a dummy wire 863 is disposed between the common signal transmission line 820 and the first gate driving signal line portion 221, and the dummy wire 863 and the start signal line 866 can be structures symmetrically arranged. The dummy wire 863 is not bonded to the circuit board, or even if it is bonded to the circuit board, it is not input with a signal, or only input with a ground signal.

In some examples, as shown in FIGS. 10-16, the wires 860 include a test signal line 864.

The difference between the test signal line 864 shown in FIG. 14 and the test signal line 550, the test signal bended line 450 and the test signal connecting line 750 shown in FIG. 5 is that the test signal line 864 shown in FIG. 14 only includes a part of the test signal bended line 450 extending in the second direction and the test signal connecting line 750 as shown in FIG. 5, while the array substrate shown in FIG. 14 does not include a part of the test signal bended line extending in the first direction as shown in FIG. 5.

For example, as shown in FIGS. 13 and 14, a dummy wire 861 is disposed between the common signal transmission line 820 and the first gate driving signal line portion 221, and the dummy wire 861 and the test signal line 864 can be structures symmetrically arranged. For example, the dummy wire 861 is not input with a signal or is input with a ground signal.

In some examples, as shown in FIGS. 10-16, part of the plurality of wires 860 close to the first data fanout wiring region 231 includes three dummy wires, such as a dummy wire 861, a dummy wire 862, and a dummy wire 863.

The dummy wire 861, the dummy wire 862 and the dummy wire 863 shown in FIG. 14 have the same features as the dummy wire 841, the dummy wire 842 and the dummy wire 843 shown in FIG. 5.

In some examples, as shown in FIG. 14, at least three ground lines 900 or at least three dummy wires 900 are disposed at one side of the gate driving structure 210 away from the display region 01. For example, the at least three ground lines 900 include a ground wire 910, a ground wire 920, a ground wire 930 and a ground wire 940. For example, the at least three dummy wires 900 include a dummy wire 910, a dummy wire 920, a dummy wire 930 and a dummy wire 940.

The at least three ground lines 900 or at least three dummy wires 900 shown in FIG. 14 include some wires in the transmission lines 500 shown in FIG. 5, such as the ground line 510, the first common signal transmission line 520, the common signal feedback line 530 and the start signal line 540.

In the case where the array substrate shown in FIG. 14 is driven by a double-side source, the transmission line configured for transmitting signals as shown in FIG. 5, which is located at one side of the gate driving structure away from the display region, is no longer configured for transmitting signals, so it is set as a ground line or a dummy wire. The interfaces of the common signal feedback line 530, the first common signal transmission line 520 and the start signal line 540 as shown in FIG. 5, are all input with GND signals or set to Dummy. The adjusted common signal feedback line, first common signal transmission line and start signal line are all input with signals by the circuit board on the upper side of the array substrate.

For example, as shown in FIG. 14, a test signal line 550 is disposed at one side of the gate driving structure 210 away from the display region 01, which has the same features as the test signal line 550 shown in FIG. 5.

For example, as shown in FIG. 14, the structures, such as the electrostatic discharge structure 810, the common signal connecting line 850, etc., in the array substrate can have the same features as the structures, such as the electrostatic discharge structure 810, the common signal connecting line 850, etc., in the array substrate shown in FIG. 5, and details will not be repeated here.

For example, when performing array test (AT) on the array substrate shown in FIG. 5, in the case where the pads shown in FIG. 4 are connected with the transmission connecting lines for testing, it is necessary to connect the pads with the transmission connecting line, the gate driving signal line and the data line by using wires in different layers from the bended line. The wire led out from the pad can be a wire in the same layer as the gate line, and this wire is electrically connected with the transmission connecting line and the gate driving signal line of the array substrate close to the dummy fanout wiring region through a wire in another layer (e.g., an indium tin oxide (ITO) wire, which is located at one side of the layer where the gate line is located away from a base substrate, and the base substrate is a substrate for setting film layers such as data lines and gate lines, etc.).

For example, when performing array test (AT) on the array substrate shown in FIG. 14, in the case where the pads shown in FIG. 4 are connected with the transmission connecting lines for testing, the wire led out from the pad can be a wire in the same layer as the gate line, and this wire is directly connected to the array substrate.

Figure 17:
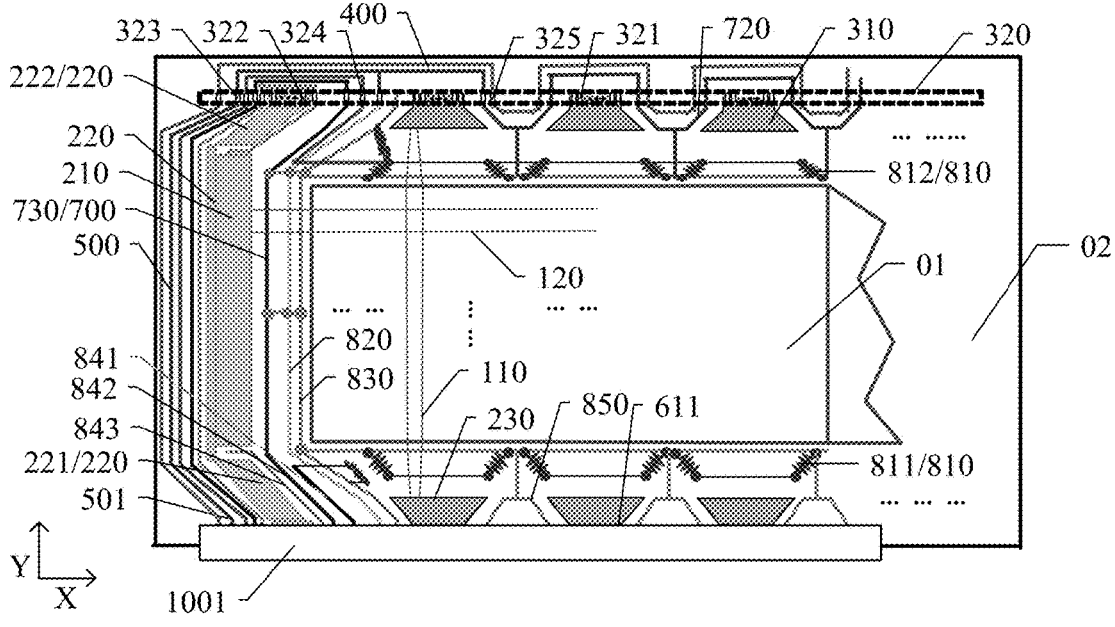
FIG. 17 is a partial planar structural view of a display panel provided by an embodiment of the present disclosure.

FIG. 17 is a partial planar structural view of a display panel provided by an embodiment of the present disclosure. As shown in FIG. 17, the display panel includes the array substrate shown in FIGS. 5-13 and a circuit board 1001. The signal ends 501 of the plurality of transmission lines 500, the first gate driving signal line portion 221 and the wires in the data fanout wiring region 230 are all electrically connected with the pads 611 in a signal pad region 610 so as to be electrically connected with the circuit board 1001. For example, the circuit board 1001 can be a flexible printed circuit board.

For example, the wires in the data fanout wiring region 230 can be electrically connected with the Chip-On-Film (COF) in the circuit board 1001, a source driver integrated circuit (Source IC) is disposed on the COF, and the signal input ends 501 of the plurality of transmission lines 500 and the first gate driving signal line portion 221 can be electrically connected with the flexible printed circuit board (PCB). The display panel shown in FIG. 17 is driven by a single-side source.

Figure 18:
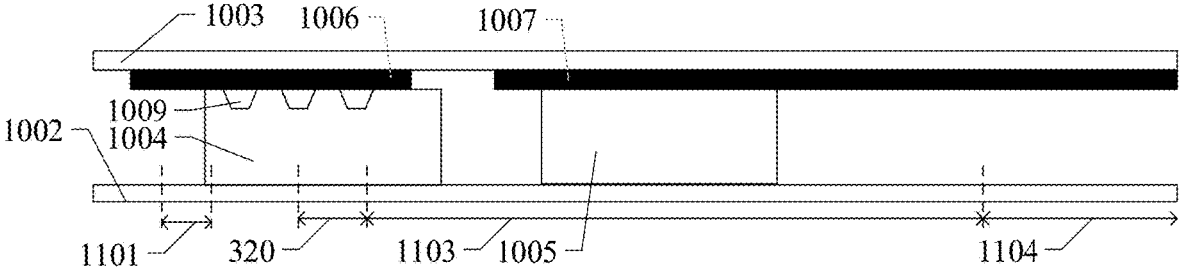
FIG. 18 is a partial cross-sectional structural view of the display panel shown in FIG. 17.

FIG. 18 is a partial cross-sectional structural view of the display panel shown in FIG. 17.

In some examples, as shown in FIGS. 5, 17 and 18, the display panel further includes an opposing substrate 1003 opposite to the array substrate 1002 and a first frame sealant 1004 located between the array substrate 1002 and the opposing substrate 1003, and the first frame sealant 1004 is disposed in the peripheral region 02. FIG. 18 illustratively shows the region 1101 where the bended line 400 shown in FIG. 5 is located, the dummy pad region 320, the region 1103 where the dummy fanout wiring region 310 is located, and all regions 1104 located at one side of the dummy fanout wiring region 310 close to the display region 01.

In some examples, as shown in FIGS. 5, 17 and 18, at least part of pads in the dummy pad region 320 overlap with the first frame sealant 1004 in the direction perpendicular to the array substrate 1002.

For example, as shown in FIG. 18, the first frame sealant 1004 can be a dummy frame sealant; in the case where the display panel is driven by a single-side source, the display panel includes the first frame sealant 1004 to protect structures, such as the pads, etc., in the dummy pad region, and prevent these structures from being corroded due to exposure. For example, the first frame sealant 1004 overlaps with some spacers (PS) 1009, and the spacers 1009 plays a supporting role. For example, the first frame sealant 1004 can be a frame sealant located only on one side of the display region in the second direction.

In some examples, as shown in FIG. 18, the display panel further includes a second frame sealant 1005 located between the array substrate 1002 and the opposing substrate 1003, the second frame sealant 1005 is located between the first frame sealant 1004 and the display region, and a first gap is disposed between the first frame sealant 1004 and the second frame sealant 1005. For example, the second frame sealant 1005 can be a circle of frame sealant surrounding the display region.

In some examples, as shown in FIG. 18, the display panel further includes a black matrix, which is located at one side of the opposing substrate 1003 facing the array substrate 1002. The black matrix includes a first black matrix 1006 overlapping with the first frame sealant 1004 and a second black matrix 1007 overlapping with the second frame sealant 1005, a second gap is disposed between the first black matrix 1004 and the second black matrix 1007, and the second gap is smaller than the first gap. By setting the second gap between the first black matrix and the second black matrix, it can prevent the opposing substrate from being charged when the panel is cut to form a display panel driven by a double-side source.

Figure 19:
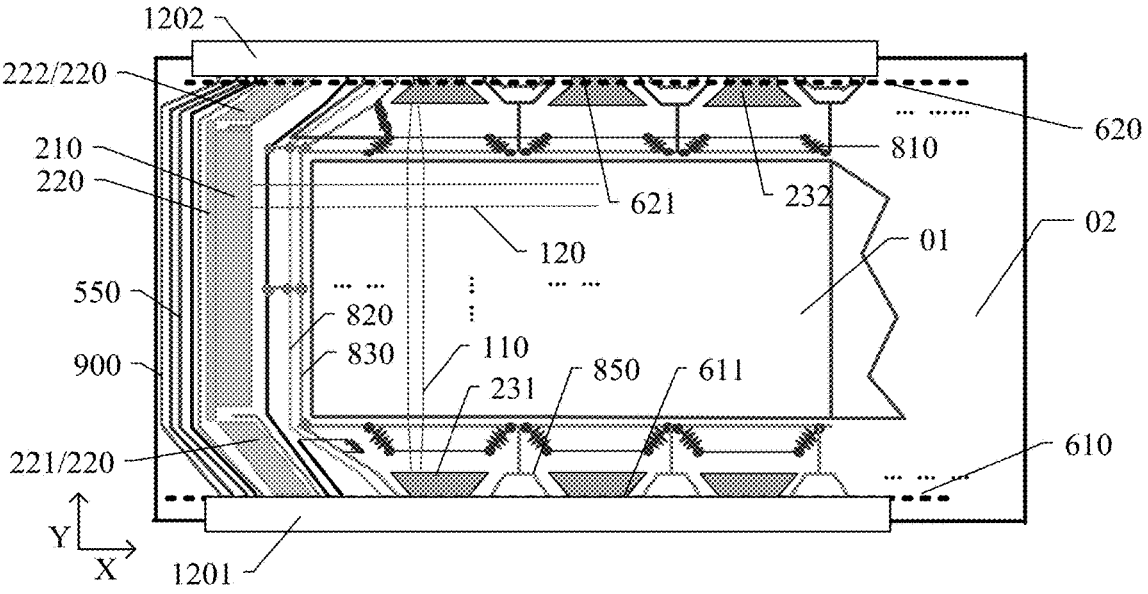
FIG. 19 is a partial planar structural view of a display panel provided by another embodiment of the present disclosure.

FIG. 19 is a partial planar structural view of a display panel provided by another embodiment of the present disclosure. As shown in FIG. 19, the display panel includes the array substrate shown in FIG. 14, and the display panel further includes a first circuit board 1201 and a second circuit board 1202. The wires in the first data fanout wiring region 231 and the first gate driving signal line portion 221 are electrically connected with the pads 611 in the first signal pad region 610 so as to be electrically connected with the first circuit board 1201, and the wires in the second data fanout wiring region 232 and the second gate driving signal line portion 222 are electrically connected with the pads 621 in the second signal pad region 620 so as to be electrically connected with the second circuit board 1202. For example, the first circuit board can be the same as the second circuit board. For example, the first circuit board and the second circuit board can both be flexible printed circuit boards. The first circuit board and the second circuit board shown in FIG. 19 can have the same features as the circuit board shown in FIG. 17, and details will not be repeated here.

Figure 20:
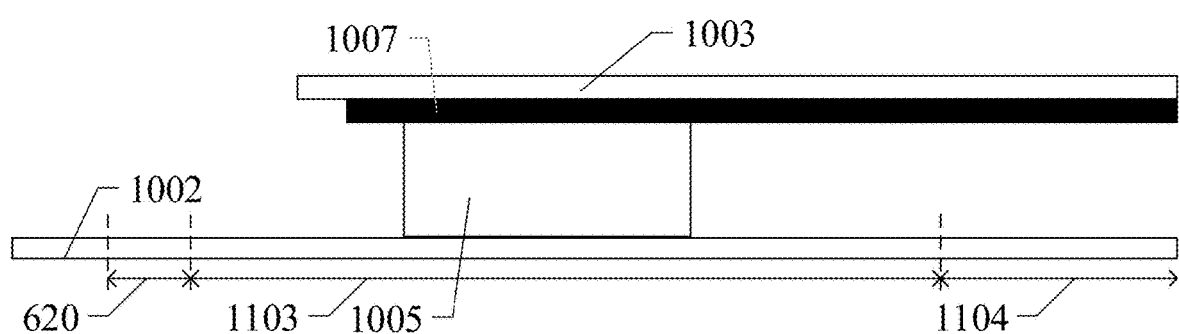
FIG. 20 is a partial cross-sectional structural view of the display panel shown in FIG. 19.

FIG. 20 is a partial cross-sectional structural view of the display panel shown in FIG. 19.

In some examples, as shown in FIGS. 14, 19 and 20, the display panel further includes an opposing substrate 1003 opposite to the array substrate 1002. In the direction perpendicular to the array substrate 1002, the opposing substrate 1003 does not overlap with at least part of the second signal pad region 620.

For example, as shown in FIGS. 17-20, the display panel further includes a liquid crystal layer located between the opposing substrate and the array substrate.

Another embodiment of the present disclosure provides a manufacturing method for forming the array substrate shown in FIG. 14 by using the array substrate shown in FIG. 5, which includes, as shown in FIGS. 5 and 14, providing the array substrate shown in FIG. 5, and cutting the bended line 400 so that only the portion, electrically connected with the third pad 323 and extending in the second direction, of the bended line 400 is retained.

After forming the array substrate shown in FIG. 5, it may be found that it is necessary to adopt double-side source driving. In this case, it is not necessary to manufacture a new array substrate, but to cut the array substrate originally adopting single-side source driving, so that the transmission line, bended line and transmission connecting line which are integrated are disconnected into two portions; for example, the portion of the bended line extending in the first direction is cut off, and the retained portion of the bended line and the transmission connecting line serve as the transmission line applied in double-side source driving. Therefore, the production cost is reduced, and at the same time, it is helpful to improve the uniformity of image quality when the array substrate is used for display, so as to flexibly meet the image quality requirements of users.

Another embodiment of the present disclosure provides a manufacturing method for forming the display panel shown in FIG. 20 by using the display panel shown in FIG. 18, which includes, As shown in FIGS. 1, 18 and 20, providing the array substrate 1 as shown in FIG. 18; providing an opposing substrate; cell assembling the array substrate and the opposing substrate; cutting off a portion of the opposing substrate covering the dummy pad region 320 in the array substrate so as to expose the dummy pad region 320; cutting the bended line 400 in the array substrate so that only a portion, electrically connected with the third pad 323 and extending in the second direction, of the bended line 400 is retained.

After forming the display panel shown in FIG. 18, it may be found that it is necessary to adopt double-side source driving. In this case, it is not necessary to manufacture a new display panel de novo, but to cut the display panel originally adopting single-side source driving, e.g., cutting off the portion of the bended line extending in the first direction, so that the transmission line, bended line and transmission connecting line which are integrated are disconnected into two portions, and the retained portion of the bended line and the transmission connecting line serve as the transmission line applied in double-side source driving. Therefore, the production cost is reduced, and at the same time, it is helpful to improve the uniformity of image quality when the display panel is used for display, so as to flexibly meet the image quality requirements of users.

For example, the cutting width of the region where the bended line is located in the array substrate can be in the range of 0.3~3 microns, such as 0.5~1.5 microns.

For example, the cutting size of the opposing substrate is greater than the cutting size of the array substrate, so as to expose the dummy pad region, and the exposed dummy pad region serves as the pad region configured to be bonded to the circuit board as shown in FIG. 14, so as to realize double-side source driving.

For example, the position where the opposing substrate is cut is located in the second gap between the first black matrix and the second black matrix.

The following statements should be noted:

(1) In the accompanying drawings of the embodiments of the present disclosure, the drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

The invention claimed is:

1. An array substrate, comprising a display region and a peripheral region located at a periphery of the display region, the array substrate comprising:

a plurality of data lines, located at least in the display region, wherein the plurality of data lines is arranged along a first direction;

a plurality of gate lines, located at least in the display region, wherein the plurality of gate lines is arranged along a second direction, and the second direction intersects with the first direction;

a gate driving structure, located in the peripheral region and at at least one side of the display region in the first direction, wherein the gate driving structure is configured to be electrically connected with the plurality of gate lines;

a plurality of gate driving signal lines, located in the peripheral region and electrically connected with the gate driving structure;

a data fanout wiring region, located in the peripheral region, wherein wires in the data fanout wiring region are configured to be electrically connected with the plurality of data lines;

wherein the array substrate further comprises a dummy fanout wiring region, a dummy pad region and a bended line located in the peripheral region, the data fanout wiring region and the dummy fanout wiring region are located at both sides of the display region in the second direction, the plurality of data lines is electrically connected with first pads in the dummy pad region through the wires in the dummy fanout wiring region, and at least part of the bended line is located at one side of the dummy pad region away from the gate driving structure;

the plurality of gate driving signal lines comprises a first gate driving signal line portion and a second gate driving signal line portion which are respectively located at both sides of the gate driving structure in the second direction, the dummy pad region is located at one side of the second gate driving signal line portion away from the gate driving structure, and the second gate driving signal line portion is electrically connected with a second pad in the dummy pad region;

a plurality of transmission lines is disposed at one side of the gate driving structure away from the display region, and at least one transmission line and the bended line are electrically connected with a same third pad in the dummy pad region.

2. The array substrate according to claim 1, wherein the at least one transmission line comprises at least one of the group consisting of a ground line, a first common signal transmission line, a common signal feedback line, a start signal line and a test signal line.

3. The array substrate according to claim 2, further comprising:

an electrostatic discharge structure, located in the peripheral region, wherein the electrostatic discharge structure comprises a first electrostatic discharge structure and a second electrostatic discharge structure located at both sides of the display region in the second direction, the first electrostatic discharge structure is located between the data fanout wiring region and the display region, wherein the at least one transmission line comprises the first common signal transmission line, the bended line comprises a first common signal transmission bended line electrically connected with the first common signal transmission line, and the dummy fanout wiring region is located between the first common signal transmission bended line and the second electrostatic discharge structure.

4. The array substrate according to claim 3, wherein the at least one transmission line comprises the test signal line, and the bended line comprises a test signal bended line;

a test signal connecting line is disposed at one side of the second gate driving signal line portion away from the test signal line, the test signal line is electrically connected with the test signal connecting line through the test signal bended line, and the test signal connecting line is electrically connected with the second electrostatic discharge structure.

5. The array substrate according to claim 3, wherein the at least one transmission line comprises the common signal feedback line, and the bended line comprises a common signal feedback bended line;

a common signal feedback connecting line is disposed at one side of the second gate driving signal line portion away from the common signal feedback line, the common signal feedback line is electrically connected with the common signal feedback connecting line through the common signal feedback bended line, and the common signal feedback connecting line is electrically connected with a first common signal transmission connecting line.

6. The array substrate according to claim 2, wherein the at least one transmission line comprises the start signal line, and the bended line comprises a start signal bended line;

a start signal connecting line is disposed at one side of the second gate driving signal line portion away from the start signal line, the start signal line is electrically connected with the start signal connecting line through the start signal bended line, and the start signal connecting line is electrically connected with the gate driving structure.

7. The array substrate according to claim 2, wherein the at least one transmission line comprises the ground line, and the bended line comprises a ground bended line;

a ground connecting line is disposed at one side, away from the ground line, of the dummy fanout wiring region closest to the gate driving signal line, and the ground line is electrically connected with the ground connecting line through the ground bended line.

8. The array substrate according to claim 2, wherein the at least one transmission line comprises the common signal feedback line and the start signal line, the bended line comprises a common signal feedback bended line and a start signal bended line, the common signal feedback line is electrically connected with a common signal feedback connecting line through the common signal feedback bended line, and the start signal line is electrically connected with a start signal connecting line through the start signal bended line;

the array substrate further comprises a second common signal transmission line located in the peripheral region, the common signal feedback connecting line is disposed between the second common signal transmission line and the second gate driving signal line portion, and a dummy wire is disposed between the second common signal transmission line and the first gate driving signal line portion.

9. The array substrate according to claim 1, wherein the data fanout wiring region and the dummy fanout wiring region are distributed approximately symmetrically with respect to a center line of the display region extending in the first direction.

10. The array substrate according to claim 1, wherein a count of bended lines is multiple, and a distance between one of the bended lines closest to the display region and an edge of the array substrate immediately adjacent to the bended line is in a range of 0.3-3 mm.

11. The array substrate according to claim 1, wherein signal input ends of the plurality of transmission lines, the first gate driving signal line portion and the wires in the data fanout wiring region are all electrically connected with pads in a signal pad region.

12. The array substrate according to claim 11, wherein the signal pad region and the dummy pad region are distributed approximately symmetrically with respect to a center line of the display region extending in the first direction.

13. A display panel, comprising the array substrate according to claim 1, wherein the display panel further comprises a circuit board; signal input ends of the plurality of transmission lines, the first gate driving signal line portion and the wires in the data fanout wiring region are all electrically connected with pads in a signal pad region so as to be electrically connected with the circuit board, and the signal pad region is located at one side of the display region away from the dummy pad region.

14. The display panel according to claim 13, further comprising an opposing substrate opposite to the array substrate and a first frame sealant located between the array substrate and the opposing substrate, wherein the first frame sealant is disposed in the peripheral region, wherein, in a direction perpendicular to the array substrate, at least part of pads in the dummy pad region overlap with the first frame sealant;

the display panel further comprising a second frame sealant located between the array substrate and the opposing substrate, wherein the second frame sealant is located between the first frame sealant and the display region, and a first gap is disposed between the first frame sealant and the second frame sealant;

the display panel further comprising: a black matrix, located at one side of the opposing substrate facing the array substrate, wherein the black matrix comprises a first black matrix overlapping with the first frame sealant and a second black matrix overlapping with the second frame sealant, a second gap is disposed between the first black matrix and the second black matrix, and the second gap is smaller than the first gap.

15. A manufacturing method of an array substrate, comprising:

providing the array substrate according to claim 1;

cutting the bended line so that only a portion, electrically connected with the third pad and extending in the second direction, of the bended line is retained.

16. An array substrate, comprising a display region and a peripheral region located at a periphery of the display region, the array substrate comprising:

a plurality of data lines, located at least in the display region, wherein the plurality of data lines is arranged along a first direction;

a plurality of gate lines, located at least in the display region, wherein the plurality of gate lines is arranged along a second direction, and the second direction intersects with the first direction;

a gate driving structure, located in the peripheral region and at at least one side of the display region in the first direction, wherein the gate driving structure is configured to be electrically connected with the plurality of gate lines;

a plurality of gate driving signal lines, located in the peripheral region and electrically connected with the gate driving structure, wherein the plurality of gate driving signal lines comprises a first gate driving signal line portion and a second gate driving signal line portion which are respectively located at both sides of the gate driving structure in the second direction;

a first data fanout wiring region, located in the peripheral region, wherein wires in the first data fanout wiring region are configured to be electrically connected with the plurality of data lines;

a second data fanout wiring region, located in the peripheral region, wherein wires in the second data fanout wiring region are configured to be electrically connected with the plurality of data lines, and the first data fanout wiring region and the second data fanout wiring region are located in the peripheral region on opposite sides, respectively, wherein the array substrate further comprises a common signal transmission line located between the display region and the gate driving structure, one end of the common signal transmission line is electrically connected with a pad close to the first gate driving signal line portion, and the other end of the common signal transmission line is electrically connected with a pad close to the second gate driving signal line portion, a count of pads between the common signal transmission line and the first gate driving signal line portion is a first number, a count of pads between the common signal transmission line and the second gate driving signal line portion is a second number, and the first number is the same as the second number.

17. The array substrate according to claim 16, wherein a plurality of wires are disposed between the common signal transmission line and the gate driving signal line;

at least one wire among the plurality of wires is only located between the common signal transmission line and the second gate driving signal line portion, and one end of the at least one wire is configured to be bonded to a circuit board so as to transmit a corresponding signal, and/or, both ends of at least one wire among the plurality of wires are connected with the pads, one end of the at least one wire located between the common signal transmission line and the second gate driving signal line portion is configured to be bonded to a circuit board so as to transmit a corresponding signal, and the other end of the at least one wire located between the common signal transmission line and the first gate driving signal line portion is transmitted with a ground signal or without any signal, and/or, at least one wire among the plurality of wires is only located between the common signal transmission line and the first gate driving signal line portion, and one end of the at least one wire is transmitted with a ground signal or without any signal.

18. The array substrate according to claim 16, wherein a plurality of wires are disposed between the common signal transmission line and the gate driving signal line; a position where the common signal transmission line is connected to transmit a common signal in the display region is located in a middle region of the display region in the second direction, the plurality of wires comprises a common signal feedback line, and the common signal feedback line is electrically connected with the common signal transmission line;

the plurality of wires comprises a start signal line, and the start signal line is electrically connected with the gate driving structure; and/or, the plurality of wires comprises a test signal line; and/or, a part of the plurality of wires close to the first data fanout wiring region comprises three dummy wires.

19. A display panel, comprising the array substrate according to claim 14, wherein the display panel further comprises a first circuit board and a second circuit board, wherein the array substrate comprises a first signal pad region and a second signal pad region, the first signal pad region and the first data fanout wiring region are located at a same side of the display region, and the second signal pad region and the second data fanout wiring region are located at a same side of the display region;

the wires in the first data fanout wiring region and the first gate driving signal line portion are electrically connected with pads in the first signal pad region so as to be electrically connected with the first circuit board, and the wires in the second data fanout wiring region and the second gate driving signal line portion are electrically connected with pads in the second signal pad region so as to be electrically connected with the second circuit board.

20. The display panel according to claim 19, further comprising an opposing substrate opposite to the array substrate, wherein in a direction perpendicular to the array substrate, the opposing substrate does not overlap with at least part of the second signal pad region.

* * * * *